(12) United States Patent
Sawano

(10) Patent No.: US 8,334,086 B2
(45) Date of Patent: Dec. 18, 2012

(54) LUMINESCENT DEVICE AND METHOD OF PRODUCING THE SAME

(75) Inventor: Mitsuru Sawano, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 140 days.

(21) Appl. No.: 12/365,466

(22) Filed: Feb. 4, 2009

(65) Prior Publication Data

US 2009/0195152 A1 Aug. 6, 2009

(30) Foreign Application Priority Data

Feb. 6, 2008 (JP) ................................. 2008-026898

(51) Int. Cl.
*G03C 8/00* (2006.01)

(52) U.S. Cl. ........ 430/200; 313/504; 313/506; 313/501; 438/29

(58) Field of Classification Search .......... 313/495–512; 438/29; 430/200
See application file for complete search history.

(56) References Cited

U.S. PATENT DOCUMENTS

| | | | | |
|---|---|---|---|---|
| 6,667,143 B2 * | 12/2003 | Nirmal et al. | ................. | 430/200 |
| 7,083,891 B2 * | 8/2006 | Shimomura et al. | .......... | 430/200 |
| 7,230,374 B2 * | 6/2007 | Suh et al. | ...................... | 313/504 |
| 8,039,068 B2 * | 10/2011 | Omata et al. | ............... | 428/32.38 |
| 2004/0074584 A1 | 4/2004 | Kishimoto | | |
| 2005/0062407 A1 | 3/2005 | Suh et al. | | |
| 2005/0118923 A1 | 6/2005 | Bellmann et al. | | |
| 2010/0239793 A1 * | 9/2010 | Andrews et al. | ........... | 428/32.69 |

FOREIGN PATENT DOCUMENTS

| | | |
|---|---|---|
| JP | 2001-130141 A | 5/2001 |
| JP | 2003-243153 A | 8/2003 |
| JP | 2003-264066 A | 9/2003 |
| JP | 2005-100939 A | 4/2005 |
| JP | 2005-235467 A | 9/2005 |
| JP | 2006-171228 A | 6/2006 |
| JP | 2007-511889 A | 5/2007 |

OTHER PUBLICATIONS

Japanese Office Action with the English translation dated Oct. 18, 2011, for Application No. 2008-026898.

* cited by examiner

*Primary Examiner* — David Vu
*Assistant Examiner* — Brandon Fox
(74) *Attorney, Agent, or Firm* — Birch, Stewart, Kolasch & Birch, LLP

(57) ABSTRACT

An electroluminescent device including a substrate on which a first electrode is formed; a transparent substrate disposed on the first electrode side of the substrate; a color filter disposed between the first electrode and the transparent substrate; an electroluminescent layer disposed between the first electrode and the color filter; and a second electrode disposed between the electroluminescent layer and the color filter.

14 Claims, 6 Drawing Sheets

LUMINESCENT DEVICE AND METHOD OF PRODUCING THE SAME

CROSS-REFERENCE TO RELATED APPLICATION

This application claims priority under 35 USC 119 from Japanese Patent Application No. 2008-026898, the disclosure of which is incorporated by reference herein.

BACKGROUND OF THE INVENTION

1. Field of the Invention

The present invention relates to a luminescent device and a method of producing the same.

2. Description of the Related Art

Organic electroluminescence (organic EL) display devices, which are a self-emitting display device, are expected to be used in applications such as displaying or illumination. For instance, organic EL display devices have such advantages in display performances as higher visibility and less viewing-angle dependency, as compared with conventional displays such as CRTs or LCDs. Furthermore, organic EL displays have advantages in reducing the weight or thickness of the display. In addition to the above, organic EL display devices have a possibility of providing illuminating devices having a shape which has never been achieved by use of a flexible substrate.

Organic EL displays include a top-emission type display, which uses a color filter, and a bottom-emission type display. Top-emission type organic EL displays that do not have a color filter on an array-side substrate having an EL layer, as shown in FIG. 8, are typically produced by separately preparing units A and B having the following structure, and then bonding them with a sealing adhesive.

(A) Array-side substrate/thin film transistor (TFT; pixel)/flattening layer/metal electrode/electron transporting layer/EL luminescent layer (pixel)/hole transporting layer/transparent electrode/protective layer (B) Seal-side substrate/color filter (pixel)

However, in the case where deformation of the array side substrate or the seal-side substrate occurs in the preparation process, the substrates tend to have a different degree of deformation. When the substrates have a different degree of deformation, positional alignment of pixels (positions indicated by "pixel" in the aforementioned (A) and (B)) that are formed on each substrate may be difficult. Occurrence of positional misalignment of the pixels may impair display characteristics such as color hue or resolution of the display, or may even damage the quality of the product.

As a method of forming pixels that form a color filter, in the cases of LCDs for instance) a method of producing pixels directly on an array-side substrate provided with a TFT by a photolithography method is known. In this method, for instance, a colored curable coating composition is applied on the array-side substrate, and development is conducted after exposing the coating to light. Accordingly, it is difficult to apply the photolithography method in the production of organic EL displays to form a color filter directly on an array-side substrate provided with an EL luminescent layer that tends to deteriorate due to moisture. If a protection is provided to cover the EL luminescent layer, the production process will become complicated and the cost will be increased.

Japanese Patent Application Laid-Open (JP-A) No. 2001-130141, for example, discloses a method of forming a luminescent layer or color filter by applying an organic material by an inkjet method to openings separated from each other by a pattern that has been formed by a transfer method using a donor sheet on a substrate onto which a pixel electrode or a luminescent layer is to be formed.

However, the above method intends to form a luminescent layer, or a color filter on a substrate on which a luminescent layer has not been formed. Therefore, when a color filter is formed after the luminescent layer has been formed, ink in the form of a liquid directly contacts the substrate on which the luminescent layer has been formed. Therefore, in order to avoid the deterioration of luminescent layer, the color filter needs to be formed on a separate substrate on which the luminescent layer is not formed.

The present invention has been made in view of the above circumstances, and intends to provide a luminescent device that can be produced at high yield and exhibit excellent display characteristics such as display color hue or resolution, and a method of producing a luminescent device in which degradation in display characteristics due to the positional misalignment of pixels can be suppressed while maintaining the production efficiency of the device.

SUMMARY OF THE INVENTION

In view of the aforementioned circumstances, a first aspect of the invention provides an electroluminescent device comprising:

a substrate on which a first electrode is formed;

a transparent substrate disposed on the first electrode side of the substrate;

a color filter disposed between the first electrode and the transparent substrate;

an electroluminescent layer disposed between the first electrode and the color filter; and a second electrode disposed between the electroluminescent layer and the color filter.

A second aspect of the invention provides a method of producing an electroluminescent device, the method comprising:

positioning a laser thermal transfer sheet on a device substrate comprising a substrate and an electroluminescent layer disposed on the substrate, the laser thermal transfer sheet comprising a photothermal conversion layer that converts laser light to heat and a thermal transfer layer containing a colorant disposed in this order on a support that is transmissive with respect to light of a laser wavelength, such that the thermal transfer layer contacts the electroluminescent layer;

irradiating a predetermined region of the laser thermal transfer sheet from the support side with laser light; and forming a color filter layer by removing the laser thermal transfer sheet from the electroluminescent layer to transfer the region of the laser thermal transfer sheet that has been irradiated with laser light to the electroluminescent layer.

A third aspect of the invention provides a method of producing an electroluminescent device, the method comprising:

positioning a laser thermal transfer sheet on a device substrate comprising a substrate and an electroluminescent layer disposed on the substrate, the laser thermal transfer sheet comprising a photothermal conversion layer that converts laser light to heat and a thermal transfer layer containing a colorant disposed in this order on a support that is transmissive with respect to light of a laser wavelength, such that the thermal transfer layer contacts a surface of the substrate;

irradiating a predetermined region of the laser thermal transfer sheet from the support side with laser light; and forming a color filter layer by removing the laser thermal transfer sheet from the substrate to transfer the region of the laser thermal transfer sheet that has been irradiated with laser light to the surface of the substrate,

BRIEF DESCRIPTION OF TEE DRAWINGS

Exemplary embodiments of the present invention will be described in detail based on the following figures, wherein.

DETAILED DESCRIPTION OF THE INVENTION

In what follows, a luminescent device of the invention and a method of producing the same will be described in detail.

The luminescent device of the invention is a display device including, between a positive electrode and a negative electrode, a luminescent layer or plural organic compound thin films including the luminescent layer.

Specifically, the luminescent device includes a substrate on which a first electrode is formed; a transparent substrate disposed on the first electrode side of the substrate; a color filter disposed between the first electrode and the transparent substrate; an electroluminescent layer disposed between the first electrode and the color filter; and a second electrode disposed between the electroluminescent layer and the color filter.

The electroluminescent layer may include, in addition to the luminescent layer, a hole injection layer, a hole transporting layer; an electron injection layer; an electron transporting layer; or the like. Further, the electroluminescent layer may also include other layers such as a barrier layer. The hole injection layer, hole transporting layer, electron injection layer, electron transporting layer and barrier layer each may have an additional function.

The type of luminescent device of the invention is not particularly limited and includes display devices that display an image and illumination devices, as long as the device has a structure including an electroluminescent layer and a color filter, and an ability of emitting light having a color,.

Further, the electroluminescent (hereinafter; abbreviated as "EL" in some cases) layer may include a layer that emits white light, or a layer that emits light of one or more colors such as red (R), green (G), blue (B), yellow (Y), magenta (M) or cyan (C). The EL layers include an organic EL layer, an inorganic EL layer and the like.

The luminescent device of the invention will be specifically described taking an organic EL display device as an example, with reference to FIGS. 1 through 7.

Figure 1:
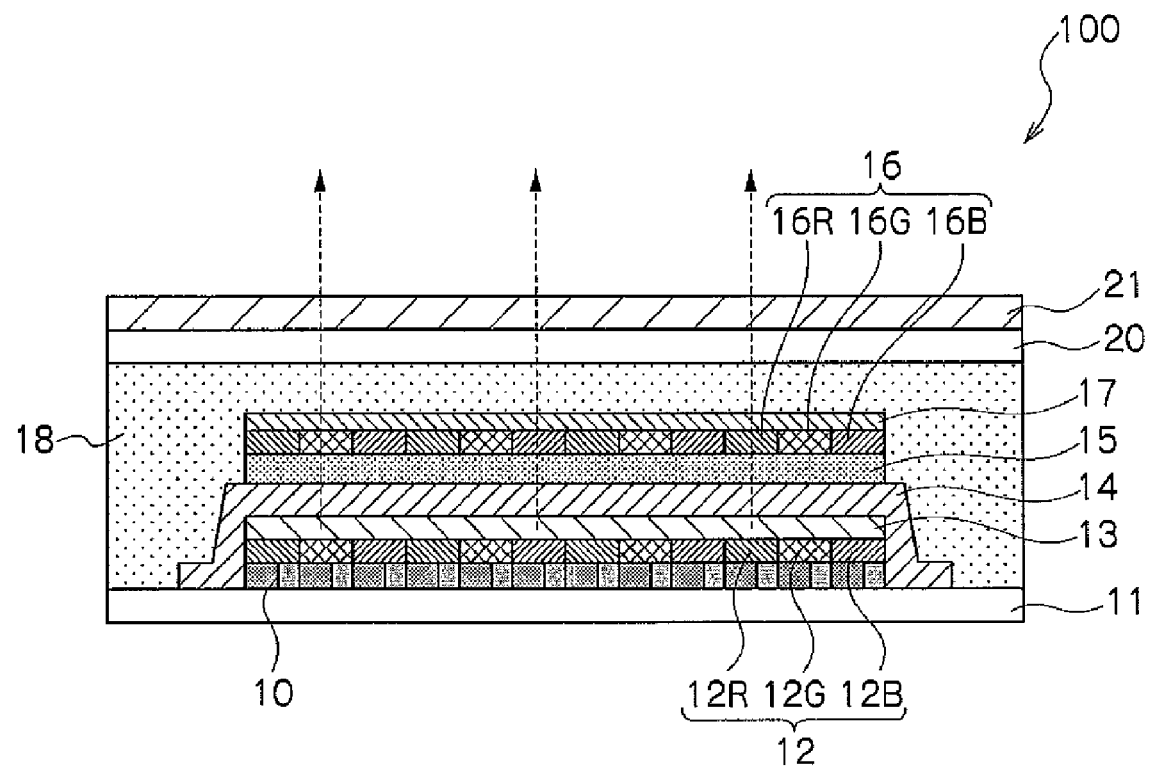
FIG. 1 is a schematic sectional view showing an example of a configuration of a top-emission organic EL display device according to one exemplary embodiment of the invention.

As shown in FIG. 1, in an organic EL display device 100 includes, on a glass substrate 11 on which electrodes such as a source electrode and a drain electrode (not shown) and TFTs 10 are disposed together with a lower electrode (positive electrode), an organic EL layer 12 including a red-emitting EL layer 12R that self-emits in red, a green-emitting EL layer 12G that self-emits in green and a blue-emitting EL layer 12B that self-emits in blue in order to be positioned on the TFTs or the like.

The red-emitting EL layer 12R, green-emitting EL layer 12G and blue-emitting EL layer 12B, which constitute an organic EL layer 12, each optionally include other layers than a luminescent layer such as a hole injection layer, a hole transporting layer, an electron injection layer or an electron transporting layer.

The material of the luminescent layer is not restricted as long as it can form a layer having an ability of injecting holes from a positive electrode, a hole injection layer or a hole transporting layer and injecting electrons from a negative electrode, an electron injecting layer or an electron transporting layer upon application of an electric field, an ability of transporting injected charges, or an ability of providing a place at which electrons and holes recombine with each other to emit light.

Preferable examples of the material for the luminescent layer include benzooxazole derivatives, benzoimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyraridine derivatives, cyclopendadiene derivatives, bisstyryl anthracene derivatives, quinacridone derivatives, pyrrolopyridine derivatives, thiadiazolopyridine derivatives, cyclopentadiene derivatives, styrylamine derivatives, aromatic dimethylidine compounds, metal complexes such as metal complexes of 8-quinolinol derivatives and rare earth complexes, and polymer compounds such as polythiophene, polyphenylene and polyphenylene vinylene.

The thickness of the luminescent layer is not particularly restricted bit preferably in the range of 1 nm to 5 μm, more preferably in the range of 5 nm to 1 μm and still more preferably in the range of 10 nm to 500 nm.

The luminescent layer may be formed by a method such as a resistance-heating deposition method, an electron-beam method, a sputtering method, a molecule-laminating method, a coating method (spin coat method, casting method, dip coating method) or an LB method without particular restrictions Among these, the resistance-heating deposition method and coating method are preferred.

The material for the hole injection layer and hole transporting layer is not particularly restricted as long as it has an ability of injecting holes from the positive electrode, transporting holes, or blocking electrons that have been injected from the negative electrode. Specific examples thereof include carbazole derivatives, triazole derivatives, oxazole derivatives, oxadiazole derivatives, imidazole derivatives, polyarylalkane derivatives, pyrazoline derivatives, pyrazolone derivatives, phenylene diamine derivatives, aryl amine derivatives, amino-substituted chalcone derivatives, styrylanthracene derivatives, fluorenone derivatives, hydrazone derivatives, stilbene derivatives, silazane derivatives, aromatic tertiary amine compounds, styryl amine compounds, aromatic dimethylidine compounds, porphyrin compounds, polysilane compounds, poly(N-vinylcarbazole) derivatives, aniline copolymers, thiophene oligomers, and conductive high-molecular oligomers such as polythiophene.

The thicknesses of the hole injection layer and hole transporting layer are not particularly restricted but usually preferably in the range of 1 nm to 5 μm, more preferably in the range of 5 nm to 1 μm, and still more preferably in the range of 10 nm to 500 nm. The hole injection layer and hole transporting layer each may have a single-layer structure formed from one or more kinds of the above-mentioned materials or a multi-layer structure formed from layers having a composition that may be the same or different.

The hole injection layer and hole transporting layer may be formed by a method such as a vacuum-deposition method, an LB method, a coating method (spin coating method, casting method, dip coating method) using a coating agent prepared by dissolving or dispersing a material for hole injection layer or hole transporting layer as mentioned above in a solvent. In the coating method, the material for hole injection layer or hole transporting layer may be dissolved or dispersed together with a resin component, such as polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, vinyl acetate, ABS resin, polyurethane, melamine resin, unsaturated polyester resin, alkyd resin, epoxy resin and silicone resin.

The material for the electron injection layer and electron transporting layer is not particularly restricted as long as it has an ability of injecting electrons from a negative electrode, transporting electrons, or blocking holes that have been injected from the positive electrode. Specific examples thereof include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidene-methane derivatives, distyrylpyrazine derivatives, heterocyclic tetracarboxylic anhydride such as naphthalene perylene, phthalocyanine derivatives, metal complexes such as metal complexes of 8-quinolinol derivatives, metal complexes having metal-phthalocyanine, benzoxazole, benzothiazole or the like as the ligand.

The thicknesses of the electron injection layer and electron transporting layer are not particularly restricted but usually preferably in the range of 1 nm to 5 μm, more preferably in the range of 5 nm to 1 μm, and still more preferably in the range of 10 nm to 500 nm. The electron injection layer and electron transporting layer each may have a single-layer structure formed from one or more kinds of the above-mentioned materials or a multi-layer structure formed from layers having a composition that may be the same or different.

The electron injection layer and electron transporting layer are formed by a method such as a vacuum-deposition method, an LB method or a coating method (spin coating method, casting method, dip coating method) using a coating agent containing a material for electron injection layer or electron transporting layer dissolved or dispersed in a solvent. In the coating method, the material for electron injection layer or electron transporting layer may be dissolved or dispersed together with a resin component as described in the above section concerning the hole injection layer and hole transporting layer.

Figure 2:
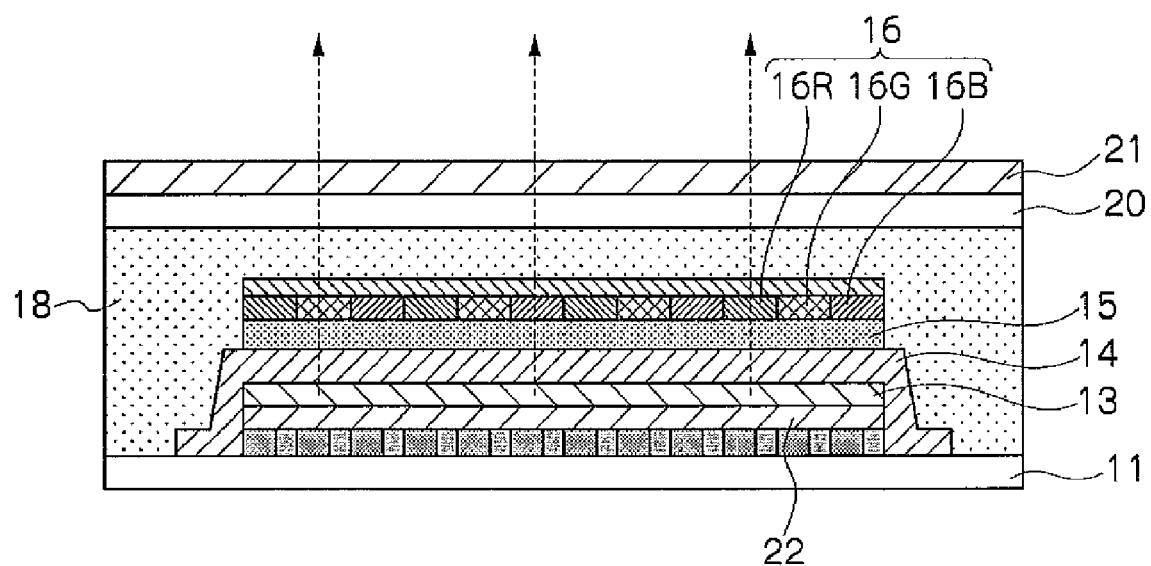
FIG. 2 is a schematic sectional view showing an example of another configuration of a top-emission organic EL display device according to one exemplary embodiment of the invention.

The luminescent device of the invention may have a configuration as shown in FIG. 1 in which an organic EL layer 12 in which EL layers (pixels) each emitting the colors of RGB are arranged in a pattern in accordance with a pattern of a color filter 16. Alternatively, the luminescent device of the invention may have a configuration as shown in FIG. 2 in which an organic EL layer 22 that emits white light is disposed and light of multiple colors is obtained by a color filter 16.

The positive electrode supplies holes to the hole injection layer, hole transporting layer, luminescent layer or the like, and the materials thereof include a metal, an alloy, a metal oxide, an electroconductive compound or a mixture thereof. The material for the positive electrode preferably has a work function of 4 eV or more. Specific examples thereof include electroconductive metal oxide such as tin oxide, zinc oxide, indium oxide, indium tin oxide (ITO) or indium zinc oxide (IZO); metal such as gold, silver, chromium or nickel; mixtures or laminates of metal and electroconductive metal oxide; inorganic electroconductive material such as copper iodide or copper sulfide; organic electroconductive material such as polyaniline, polythiophene or polypyrrole; and laminates of organic electroconductive material and ITO. Among these, the electroconductive metal oxide is preferred, and ITO and IZO are particularly preferred from the viewpoint of productivity, high electroconductivity and transparency.

The thickness of the positive electrode may be appropriately selected depending on the material, but usually preferably in the range of 10 nm to 5 μm, more preferably in the range of 50 nm to 1 μm and still more preferably in the range of 100 nm to 500 nm.

The positive electrode is usually in the form of a layer formed on a substrate of soda-lime glass, an alkali-free glass or a transparent resin. The material for the glass substrate is preferably alkali-free glass in order to suppress the amount of ions eluting from the substrate. When a soda-lime glass is used, a barrier coat made of silica or the like is preferably applied thereon. The thickness of the substrate is not particularly restricted as long as it maintains sufficient mechanical strength. However, when the glass substrate is used, the thickness thereof is usually 0.2 mm or more and more preferably 0.7 mm or more.

The sheet resistance of the positive electrode is preferably low, for example, several hundred Ω/□ or less.

The positive electrode may be formed by various kinds of method depending on the material. When ITO is used, the positive electrode may be formed by an electron-beam method, a sputtering method, a resistance-heating deposition method, a chemical-reaction method (such as sol-gel method) or a coating method using a dispersion of ITO to form a film. It is also possible to lower the driving voltage or enhance the light-emission efficiency of the display device by performing washing or other process to the positive electrode. For example, UV-ozone treatment or the like is effective for the positive electrode formed from ITO.

A common upper electrode (negative electrode) 13 is formed on organic EL layer 12 so as to cover organic EL layer 12.

The negative electrode supplies electrons to the electron injection layer, electron transporting layer; luminescent layer or the like, and the material for the negative electrode is selected considering adhesiveness of the negative electrode to an adjacent layer (such as the electron injection layer; electron transporting layer or luminescent layer), ionization potential, stability, or the like. The materials for the negative electrode include metals, alloys, metal oxides, electroconductive compounds or mixtures thereof Specific examples thereof include alkali metals (such as Li, Na and K) or fluorides thereof, alkaline earth metals (such as Mg and Ca) or fluorides thereof, gold, silver, lead, aluminum, sodium-potassium alloy or mixed metal thereof, lithium-aluminum alloy or mixed metal thereof, magnesium-silver alloy or mixed metal thereof, and rare earth metals such as indium and ytterbium. The material for the negative electrode preferably has a work function of 4 eV or less, more preferably aluminum, lithium-aluminum alloy or mixed metal thereof, or magnesium-silver alloy or mixed metal thereof. The thickness of the negative electrode may be appropriately selected depending on the material, but usually preferably in the range of 10 nm to 5 μm, more preferably in the range of 50 nm to 1 μm and still more preferably in the range of 100 nm to 500 nm.

The negative electrode is prepared by a method such as an electron-beam method, a sputtering method, a resistance-heating deposition method or a coating method. Metal of a single substance may be deposited, or two or more components may be deposited at the same time. Further, an alloy electrode may be formed by depositing two or more kinds of metal at the same time, or may be formed from an alloy that has been prepared prior to the deposition.

The sheet resistance of the negative electrode is preferably low, for example, several hundred Ω/□ or less.

A protection layer may be provided on the surface of the display by forming a gas barrier film that also functions to prevent the intrusion of a gas. Details of the gas barrier film will be described later.

A passivation layer 14 is disposed, as shown in FIG. 1, on common upper electrode (negative electrode) 13 so as to cover the entire structure including the organic EL layer and the like to prevent the intrusion of moisture or oxygen that promotes deterioration of the organic EL layer or the like.

The material for the passivation layer is not particularly restricted as long as it has an ability of preventing the intrusion of moisture or oxygen that promotes the deterioration of the organic EL layer or the like. Specific examples thereof include metals such as in, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal nitrides such as $SiN_2$, metal oxynitrides such as SiON, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorofluoroethylene, copolymers obtained by copolymerizing a monomer mixture containing tetrafluoroethylene and at least one kind of comonomer, fluorine-containing copolymers having a ring structure in a copolymer main chain, water-absorbing materials having a water absorption of 1% or more, and moistlire-proof materials having a water absorption of 0.1% or less.

The method of forming the passivation layer is not particularly restricted, and examples thereof include a vacuum-deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method and a coating method.

A transparent image-receiving layer 15 is laminated on passivation layer 14. The transparent image-receiving layer improves the transferability of a colored thermal transfer layer by enhancing the adhesiveness thereof by heat generated by a laser upon formation of the color filter by a transfer method as described later. By forming the transparent image-receiving layer in a region for a color filter prior to the formation of the color filter, transferring (so-called thin-film transferring) of an image having a sharp edge as shown in FIG. 4 may be achieved, thereby enabling the formation of a color filter having excellent fineness and resolution.

The transparent image-receiving layer is preferably formed from a resin material in order to have a thermal-adhesiveness. The term "thermal-adhesiveness" refers to the nature of the material that exhibits little adhesion when no heat applied but exhibits adhesion when heat is applied.

Examples of the resin material for the transparent image-receiving layer include polyolefins such as polyethylene and polypropylene ethylene copolymers such as a copolymer of ethylene and vinyl acetate and a copolymer of ethylene and acrylic acid ester, polyvinyl chloride, vinyl chloride copolymer such as a copolymer of vinyl chloride and vinyl acetate, polyvinylidene chloride, vinylidene chloride copolymer, poly(meth)acrylic acid ester, polyamide resins such as copolymerized nylon and N-alcoxymethylated nylon, synthetic rubbers such as acrylic rubber, organic high-molecular polymers such as chlorinated rubber, acetal resins such as vinyl acetate copolymer and polyvinyl butyral, alkyl acrylate/acrylamide copolymer; modified polyvinyl alcohol, phenolic resin, epoxy resin, urethane resin, polyester resin, urea resin, melamine resin, alkyd resin, maleic acid resin, hydroxy styrene copolymer, sulfoneamide resin, cellulose resin, ester gum, and rosin. The material for the transparent image-receiving layer is particularly preferably polyvinyl butyral or alkyl acrylate/acrylamide copolymer.

In the aforementioned resin materials, an additive such as an adhesiveness improver, a plasticizer, a releasing agent or a surfactant may be added in order to satisfy the relationship of adhesive forces at each interface.

The thickness of the transparent image-receiving layer is preferably in the range of 0.1 μm to 10 μm, more preferably in the range of 0.5 μm to 5 μm.

The transparent image-receiving layer may be formed by applying a composition including the aforementioned resin material. However, from the viewpoint of avoiding the influence of moisture on the organic EL layer, for instance, a method is applicable in which an image-receiving sheet having a cushion layer and a transparent image-receiving layer formed on a support in this order is used to transfer only the transfer image-receiving layer to the surface of passivation layer 14 to form image-receiving layer 15.

The support for the image-receiving sheet is usually formed from a chemically and thermally stable plastic material, and examples thereof include polyesters (such as polyethylene terephthalate and polyethylene naphthalate), polyamide, polycarbonate, polyether sulfone, polyimide, polyolefin (such as polyethylene and polypropylene), polyvinyl chloride, polyurethane, polyvinylidene chloride, polyacrylate and cellulose acetate. Among these, polyethylene terephthalate and polypropylene are preferred, and polyethylene terephthalate is particularly preferred from the viewpoint of dimensional stability or the like.

The thickness of the support is preferably in the range of 50 to 250 μm, and more preferably in the range of 75 to 150 μm. The surface of the support to which the cushion layer is to be disposed may be primer-coated in order to facilitate the application of a coating agent for the cushion layer, or may be surface-treated by corona discharge or glow discharge in order to improve the adhesive force of the support. Alternatively, a primer layer may be provided on the surface of the support. The primer layer is not particularly restricted as long as it can improve the adhesive force between the support and the cushion layer, but a silane coupling agent is particularly preferably used. Further, the support may be subjected to antistatic treatment or matting treatment.

The cushion layer is preferably formed from a resin material, and at least one of the material is preferably selected from the organic high-molecular polymer that may be used for the aforementioned transparent image-receiving layer. Among these, high-molecular polymers (such as polyvinyl chloride, copolymer of vinyl chloride and vinyl acetate, copolymer of vinyl chloride and vinyl alcohol and copolymer of vinyl chloride, vinyl acetate and maleic acid) having a polymerization degree of from 200 to 2000 are particularly preferred. The reasons for this is that polyvinyl chloride and vinyl chloride copolymer exhibit substantially no adhesiveness at room temperature; that they have a relatively small elastic modulus that enables favorable adhesion to irregularities of a transferred image upon thermal transfer; that they exhibit an interlayer adhesive force that can be readily controlled by the effect of a hydroxyl group or carboxyl group in the copolymer component; and that they have an elastic modulus that can readily controlled by a plasticizer in particular.

The thickness of the cushion layer is preferably in the range of 1 µm to 50 µm, more preferably in the range of 5 µm to 30 µm. The reasons for this is that the cushion layer needs to be thicker than the difference in surface irregularities of an adherend, i.e., the substrate having an organic EL layer (passivation layer in the present case); that external matters attached to the adherend need to be absorbed; and that sufficient cushioning properties need to be achieved. Further, the cushion layer preferably has an elastic modulus of 200 kg·f/cm$^2$ or less. When the elastic modulus is as low as this range, transferring of the transparent image-receiving layer can be performed with sufficient cushioning properties.

A plasticizer may be further added to the organic high-molecular polymer Details of the plasticizer are described, for example, in paragraph [0050] of JP-A No. 9-169165. Further, various kinds of polymer, adhesiveness improvers, surfactant or releasing agent may also be added.

When a vinyl chloride resin is used as the high-molecular polymer, it is also effective to add an organic tin-based stabilizer such as butyl tin-based stabilizer or octyl tin-based stabilizer generally known as a stabilizer for polyvinyl chloride and vinyl chloride copolymer.

In order to cause the interlayer separation between the organic high-molecular polymer in the cushion layer and the organic high-molecular polymer in the transparent image-receiving layer upon transferring, it is important to adjust the balance of adhesive force of each layer. In order to control the interlayer adhesive force of each layer, it is effective to prevent the intermixing of layers upon multilayer coating by selecting the coating solvent, selecting the combination of material so that a hydrophilic polymer and a lipophilic polymer or a polar polymer and a non-polar polymer are used for respective layers, or adding an adhesiveness improver such as a silane coupling agent, fluorine-based or silicone-based additives having a releasing ability or a surfactant to the cushion layer or the image-receiving layer.

On the transparent image-receiving layer, an overcoat layer formed from a releasing agent or a lubricant may be disposed in order to improve the slipperiness or scratch resistance of the transparent image-receiving layer. The materials for the overcoat layer include one or more kinds selected from higher fatty acids such as palmitic acid and stearic acid, fatty acid metal salts such as zinc stearate, fatty acid esters or partially saponified products thereof fatty acid derivatives such as fatty acid amide, higher alcohols, derivatives such as ethers of polyhydric alcohols, waxes such as paraffin wax, Carnauba wax, Montan wax, bees wax, Japan wax and candelilla wax, cationic surfactants such as an ammonium salt or a pyridinium salt having a long-chain aliphatic group, and anionic, nonionic and perfluoro-based surfactants having a long-chain aliphatic group.

Color filter 16 is formed on transparent image-receiving layer 15 that has been transferred to the substrate (passivation layer) prior to the formation of the color filter. In the invention, since the color filter is directly disposed above the organic EL layer that has already been formed on the substrate, formation of the color filter can be favorably conducted by a laser-transfer process using a thermal transfer sheet as described below, without causing deterioration of the organic EL layer.

Figure 3:
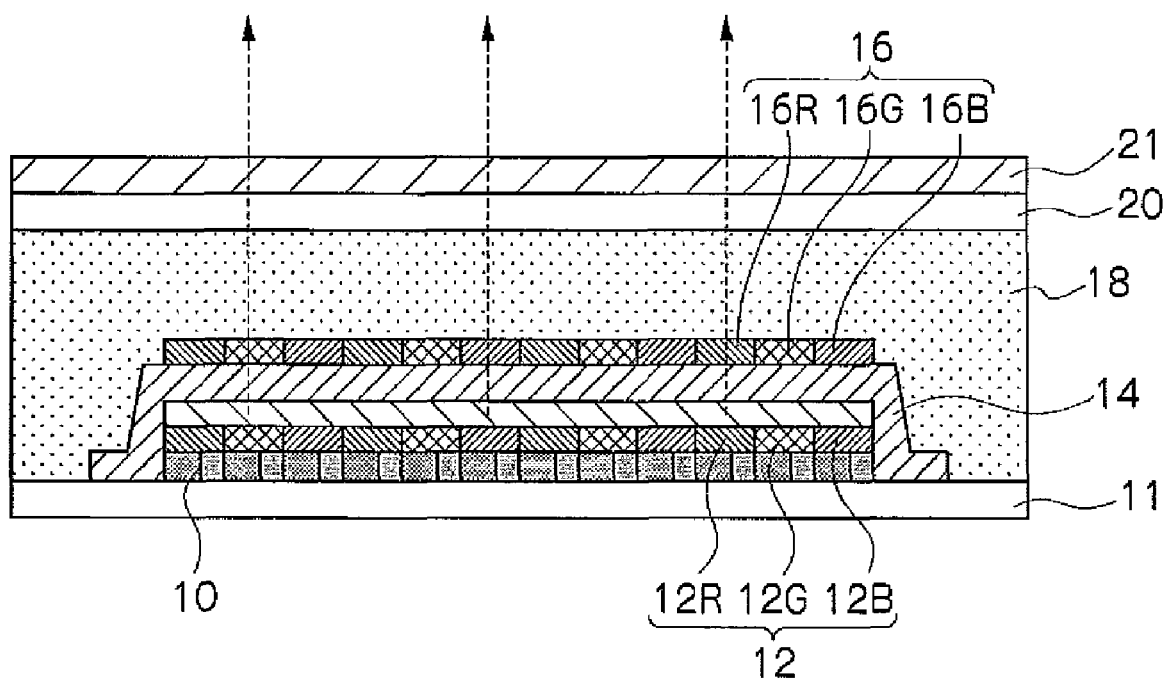
FIG. 3 is a schematic sectional view showing an example of still another configuration of a top-emission organic EL display device according to one exemplary embodiment of the invention.

In the above description, color filter 16 is formed on transparent image-receiving layer 15. However, as shown in FIG. 3, color filter 16 may be directly formed on passivation layer 14 without interposing transparent image-receiving layer 15.

Figure 4A:
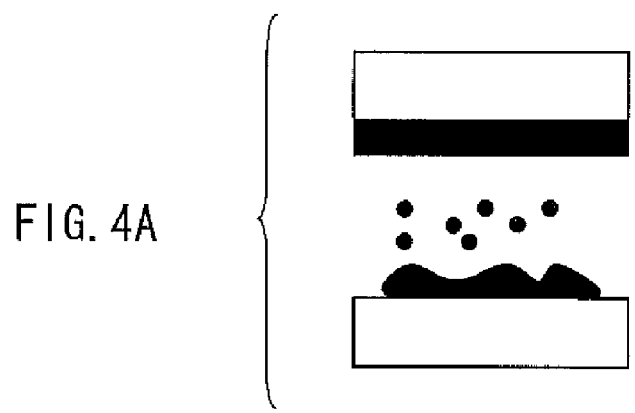
FIGS. 4A through 4D are drawings for explaining a method of forming an image by a transfer method.
Figure 4B:
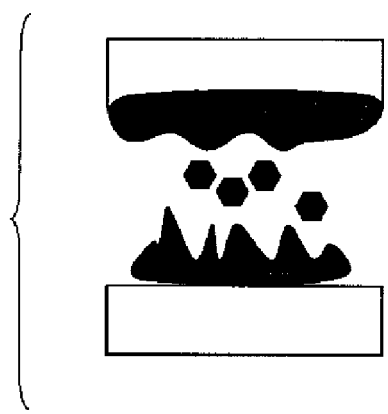
Figure 4C:
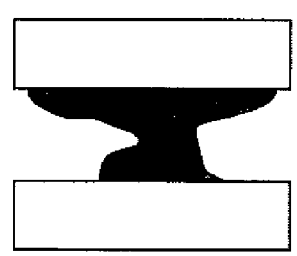
Figure 4D:
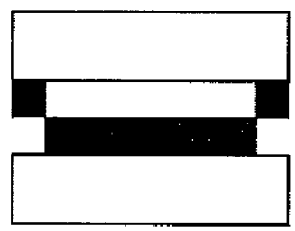

When color filter 16 is formed on transparent image-receiving layer 15, laser-transfer can be conducted by applying laser beams while contacting a thermal transfer layer of the thermal transfer sheet with transparent image-receiving layer 15. In this way, as shown in FIG. 4D, a transferred image having a shape edge can be obtained compared to the transferred image obtained by a sublimation method (FIG. 4A), an ablation method (FIG. 4B) or a melt-transfer method (FIG. 4C).

A scattering member 17 may be formed on an exposed surface of color filter 16 in order to enhance the light extraction efficiency of light that has been transmitted through color filter 16. Scattering member 17 includes an acrylic copolymer (binder), $ZrO_2$ filler (inorganic fine particles for controlling refractive index) and polymethyl methacrylate beads (light-scattering particles). The composition of scattering member 17 is not particularly restricted to the above and may be formed by arbitrarily selecting from compositions including a binder and light-scattering particles.

Examples of the binders that may be included in the scattering member include a tackifier, an adhesive and a transparent resin. Further; inorganic fine particles may be mixed in the scattering member in order to control the refractive index.

Examples of preferable material for the tackifier include pressure-sensitive tackifiers such as rubber-based tackifiers, acrylic tackifiers, silicone-based tackifiers, urethane-based tackifiers, polyether-based tackifiers and polyester-based tackifiers.

In the case of the acrylic tackifier, monomers that may be used for the acrylic polymer (i.e., a base polymer) include various kinds of (meth)acrylates (hereinafter; the term "(meth)acryl" refers to both acryl and methacryl). Specific examples of (meth)acrylates include methyl(meth)acrylate, ethyl(meth)acrylate, butyl(meth)acrylate and 2-etlhylhexyl (meth)acrylate, which may be used alone or in a combination of two or more. Further, a small amount of (meth)acrylic acid may be used in place of part of the (meth)acrylate in order to impart a polarity to the resultant acrylic polymer. As a crosslinkable monomer, glycidyl(meth)acrylate, 2-hydroxyethyl(meth)acrylate or N-methylol(meth)acrylamide may also be used in combination. Other copolymerizable monomers such as vinyl acetate or styrene may be used in combination to such an extent that the tackiness of (meth)acrylate polymer is not impaired.

In the case of the rubber-based tackifier; examples of the base polymer include natural rubber, isoprene rubber, styrene-butadiene-based rubber, regenerated rubber, polyisobutylene-based rubber, styrene-isoprene-styrene-based rubber and styrene-butadiene-styrene-based rubber.

In the case of the silicone-based tackifier, examples of the base polymer include dimethylpolysiloxane and diphenylpolysiloxane.

In the case of the polyether-based tackifier, examples of the base polymer include polyvinyl ethyl ether, polyvinyl butyl ether, and polyvinyl isobutyl ether.

The tackifier may include a crosslinking agent. Examples of the crosslinking agent include polyisocyanate compounds, polyamine compounds, melamine resins, urea resins and epoxy resins. The tackifier may further contain existing tackiness imparting agent, plasticizer, filler, anti-oxidant or UV-absorbent as required, without departing the object of the invention.

The tackifier may include a high refractive index monomer and/or ultrafine particles of high refractive index metal oxide, in addition to the above materials. Examples of the high refractive index monomer include bis(4-methacryloylthiophenyl)sulfide, vinyl naphthalene, vinyl phenyl sulfide and 4-methacryloxyphenyl-4'-methoxyphenylthioether.
Examples of the high refractive index metal oxide ultrafine particles include fine particles of at least one selected from oxides of zirconium, titanium, aluminum, indium, zinc, tin and antimony, having a particle diameter of 100 nm or less, preferably of 50 nm or less. Preferable examples of the high refractive index metal oxide ultrafine particles include ultrafine particles of at least one kind of oxide of metals selected from Al, Zr, Zn, Ti, In and Sn, specific examples thereof including $ZrO_2$, $TiO_2$, $Al_2O_3$, $In_2O_3$, ZnO, $SnO_2$, $Sb_2O_3$ and ITO. Among these, $ZrO_2$ is particularly preferably used. The addition amount of the high refractive index monomer or metal oxide ultrafine particles are preferably in the range of 10 to 90 mass %, and more preferably in the range of 20 to 80 mass % in the total mass of the tackifier.

The tackifier may contain low refractive index ultrafine particles in addition to the above materials. Examples of the low refractive index ultrafine particles include silica fine particles having a particle diameter of 100 nm or less, preferably 50 nm or less. Further, hollow silica containing air in the particle to exhibit an even lower refractive index may also be used. The addition amount of the low refractive index ultrafine particles is preferably in the range of 10 to 90 mass % and more preferably in the range of 20 to 80 mass % in the total mass of the tackifier.

The method of forming the scattering member using a tackifier in the organic EL display device is not particularly restricted, and applicable methods include a method of coating a solution containing the tackifier on the organic EL display device and drying, or a method of transferring a layer containing the tackifier from a release sheet to the organic EL device.

The thickness of the scattering member using the tackifier is not particularly restricted, but the dry thickness thereof is preferably in the range of about 0.1 to 40.0 μm, more preferably in the range of about 0.5 to 10.0 μm, and most preferably in the range of about 1.0 to 7.5 μm.

Subsequently, an adhesive agent that may be used as a binder for the scattering member will be described.

The adhesive agent is preferably an adhesive agent that exhibits a fluidity upon application of heat or pressure, and particularly preferably an adhesive agent that exhibits a fluidity upon application of heat of 200° C. or less or pressure of 1 kgf/cm$^2$ or more. By using an adhesive agent having the above property, a member such as transparent substrate can be bonded to an adherend such as a display or a plastic sheet by allowing the adhesive agent to flow. Therefore, the optical film is readily adhered to the adherend even if it has a curved or complicated shape, by a method of lamination or pressure molding, particularly by pressure molding. In this case, the softening temperature of the adhesive agent is preferably 200° C. or less.

As the adhesive agent that exhibits fluidity upon application of heat or pressure, thermoplastic resins shown below are cited as typical ones. Examples include (di)enes such as natural rubbers (refractive index n=1.52), polyisoprene (n=1.521), poly-1,2-butadiene (n=1.50), polyisobutene (n=1.505 to 1.51), polybutene (n=1.513), poly-2-heptyl-1,3-butadiene (n=1.50), poly-2-t-butyl-1,3-butadiene (n=1.506) and poly-1,3-butadiene (n=1.515); ethers such as polyoxyethylene (n=1.456), polyoxypropylene (n=1.450), polyvinyl ethyl ether (n=1.454), polyvinyl hexyl ether (n=1.459) and polyvinyl butyl ether (n=1.456); polyesters such as polyvinyl acetate (n=1.467) and polyvinyl propionate (n=1.467); polyurethane (n=1.5 to 1.6); ethyl cellulose (n=1.479); polyvinyl chloride (n=1.54 to 1.55); polyacrylonitrile (n=1.52); polymethacrylonitrile (n=1.52); polysulfone (n=1.633); polysulfide (n=1.6); phenoxy resins (n=1.5 to 1.6); and poly(meth) acrylates such as polymethyl acrylate (n=1.469), polybutyl acrylate (n=1.466), poly-2-etlhylhexyl acrylate (n=1.463), poly-t-butyl acrylate (n=1.464), poly-3-ethoxypropyl acrylate (n=1.465), polyoxycarbonyl tetramethylene (n=1.465), polymethyl acrylate (n=1.472 to 1.480), polyisopropyl methacrylate (n=1.473), polydodecyl methacrylate (n=1.474), polytetradecyl methacrylate (n=1.475), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.487), poly-1,1-diethylpropyl methacrylate (n=1.489) and polymethyl methacrylate (n=1.489). These polymers may be used alone or in combination of two or more, as necessary.

The softening temperature of the polymer used in the adhesive agent is preferably 200° C. or less, and more preferably 150° C. or less from the viewpoint of handling properties. Since the scattering member is usually used in an environment of 80° C. or less, the softening temperature of the adhesive agent layer is most preferably in the range of 80 to 120° C. from the viewpoint of processability. On the other hand, the weight average molecular weight (measured based on a calibration curve of reference polystyrene by a gel permeation chromatography, the same applies hereinafter) of the polymer is preferably 500 or more. When the weight average molecular weight is less than 500, the cohesive force of a composition for the adhesive agent may be too low to maintain the adhesiveness of the adhesive agent to the adherend.

In the adhesive agent, additives such as a diluent, a plasticizer, an anti-oxidant, a filler, a coloring agent, a UV-absorbent or a tackiness-imparting agent may be blended as required.

The thickness of the adhesive agent layer is preferably in the range of 1 to 50 μm, and more preferably in the range of 1 to 20 μm.

Examples of the material for the adhesive agent include bisphenol A epoxy resins, bisphenol F epoxy resins, tetrahydroxyphenylmethane epoxy resins, novolac epoxy resins, resorcin epoxy resins, polyalcohol-polyglycol epoxy resins, polyolefin epoxy resins, alicyclic epoxy resins, and halogenated bisphenol epoxy resins (each having a refractive index from 1.55 to 1.60).

Examples of the material other than the aforementioned epoxy resins include; (di)enes such as natural rubbers (n=1.52), polyisoprene (n=1.521), poly-1,2-butadiene (n=1.50), polyisobutene (n=1.505 to 1.51), polybutene (n=1.5125), poly-2-heptyl-1,3-butadiene (n=1.50), poly-2-t- butyl-1,3-butadiene (n=1.506) and poly-1,3-butadiene (n=1.515); polyethers such as polyoxyethylene (n=1.4563), polyoxypropylene (n=1.4495), polyvinyl ethyl ether (n=1.454), polyvinyl hexyl ether (n=1.4591) and polyvinyl butyl ether (n=1.4563); polyesters such as polyvinyl acetate (n=1.4665) and polyvinyl propionate (n=1.4665); polyurethanes (n=1.5 to 1.6); ethylcellulose (n=1.479); polyvinyl chlorides (n=1.54 to 1.55); polyacrylonitrile (n=1.52); polymethacrylonitrile (n=1.52); polysulfone (n=1.633); polysulfide (n=1.6); and phenoxy resins (n=1.5 to 1.6). These materials exhibit favorable visible light transmittance.

Examples of the materials other than the above resins include poly(meth)acrylates such as polyethyl acrylate (n=1.4685), polybutyl acrylate (n=1.466), poly-2-ethylhexyl acrylate (n=1.463), poly-t-butyl acrylate (n=1.4638), poly-3-ethoxypropyl acrylate (n=1.465), polyoxycarbonyl tetramethacrylate (n=1.465), polymethyl acrylate (n=1.472 to 1.480), polyisopropyl methacrylate (n=1.4728), polydodecyl methacrylate (n=1.474), polytetradecyl methacrylate (n=1.4746), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.4868), polytetracarbanyl methacrylate (n=1.4889), poly-1,1-diethylpropyl methacrylate (n=1.4889) and polymethyl methacrylate (n=1.4893). Two or more of these acrylic polymers may be copolymerized or blended as required.

The copolymer resins of an acrylic monomer and a monomer other than the acrylic monomer may also be used and examples include epoxy acrylates (n=1.48 to 1.60), urethane acrylates (n=1.5 to 1.6), polyether acrylates (n=1.48 to 1.49) and polyester acrylates (n=1.48 to 1.54). The urethane acrylates, epoxy acrylates and polyether acrylates are particularly preferable from the viewpoint of adhesiveness. Examples of the epoxy acrylates include (meth)acrylic acid adducts of 1,6-hexanediol diglycidyl ether, neopentyl glycol diglycidyl ether, allylalcohol diglycidyl ether, resorcinol diglycidyl ether, diglycidyl adipate, diglycidyl phthalate, polyethylene glycol diglycidyl ether, trimethyloipropane triglycidyl ether, glycerin triglycidyl ether, pentaerythritol tetraglycidyl ether and sorbitol tetraglycidyl ether Since epoxy acrylates have a hydroxyl group in the molecule, these are effective for improving the adhesion property. The copolymer resins may be used in combination of two or more as required.

The weight-average molecular weight of the polymer used as a main component of the adhesive agent is 1,000 or more. When the weight-average molecular weight is 1,000 or less, the cohesive force of a composition for the adhesive agent may too low to maintain the adhesiveness to the adherend.

The adhesive agent may contain, in addition to the above-mentioned materials, monomers having high refractive index and/or ultrafine particles of metal oxides having high refractive index. Examples of the high refractive index monomer include bis(4-methacryloylthiophenyl)sulfide, vinyl naphthalene, vinyl phenyl sulfide and 4-methacryloxyphenyl-4'-methoxyphenylthioether. Preferable examples of the high refractive index metal oxide ultrafine particles include ultrafine particles of at least one selected from oxides of zirconium, titanium, aluminum, indium, zinc, tin and antimony having a particle diameter of 100 nm or less, preferably 50 nm or less. The metal oxide ultrafine particles having high refractive index are preferably ultrafine particles of at least one kind of oxide of metals selected from Al, Zr, Zn, Ti, In and Sn, and specific examples thereof include $ZrO_2$, $TiO_2$, $Al_2O_3$, $In_2O_3$, ZnO, $SnO_2$, $Sb_2O_3$ and ITO. Among these, $ZrO_2$ is particularly preferably used.

The addition amount of the high refractive index monomer or metal oxide ultrafine particles is preferably in the range of 10 to 90 mass % and more preferably in the range of 20 to 80 mass % in the total mass of the adhesive agent.

Further, the adhesive agent may contain ultrafine particles having low refractive index in addition to the above materials. Examples of the ultrafine particles having low refractive index include silica fine particles having a particle diameter of 100 nm or less, preferably 50 nm or less. Hollow silica containing air in the particle to have an even lower refractive index may also be used. The addition amount of the low refractive index ultrafine particles is preferably in the range of 10 to 90 mass % and more preferably in the range of 20 to 80 mass % in the total weight of the adhesive agent.

A hardening agent (or crosslinking agent) may be added to the adhesive agent. Examples of the crosslinking agent include amines such as triethylenetetramine, xylenediamine and diaminodiphenylmethane; acid anhydrides such as phthalic anhydride, maleic anhydride, dodecylsuccinic anhydride, pyromellitic anhydride and benzophenonetetracarboxylic anhydride; diaminodiphenylsulfone; tris(dimethylaminomethyl)phenol; polyamide resins; dicyandiamide; and ethylmethylimidazole. These hardening agents may be used alone or in combination of two or more kinds thereof.

The addition amount of the crosslinking agent is preferably selected from 0.1 to 50 parts by mass, and more preferably 1 to 30 parts by mass with respect to 100 parts by mass of the polymer. When the addition amount is 0.1 parts by mass or more hardening of the adhesive agent may be excellent. When the addition amount is 50 parts by mass or less, excessive crosslinking may not be caused and adverse affect on the adhesiveness may be avoided. An additive such as a diluent, a plasticizer an antioxidant a filler or a tackifier may be blended to a resin composition of the adhesive agent, as required. The resin composition of the adhesive agent is coated so as to partially or entirely cover a base of a constituent material provided with a geometrical pattern depicted with a conductive material on a surface of the transparent plastic base, followed by drying a solvent and curing by heating, thereby an adhesive film involving the invention is formed. Thus-obtained adhesion film having the electromagnetic-shielding property and transparency, owing to the adhesive agent of the adhesive film, may be directly bonded to a display such as CRT, PDP, liquid crystal or EL devices, or may be bonded to a plate or sheet such as an acrylic plate or a glass plate for use in the display.

The adhesive agent is preferably colorless so that the color originally exhibited by a display does not change. However, even when the resin per se is colored, it may be possible to consider that the adhesive agent has substantially no color if the thickness of the adhesive agent is small enough. Further, in order to absorb UV-rays or infrared rays, the adhesive agent may include a material that absorbs light in the corresponding wavelength region.

Examples of the adhesive agent having aforementioned characteristics include acrylic resins, α-olefin resins, vinyl acetate resins, acrylic copolymer resins, urethane resins, epoxy resins, vinylidene chloride resins, vinyl chloride resins, ethylene-vinyl acetate resins, polyamide resins, and polyester resins. Among these, acrylic resins are preferred. Even when the same resin is used, the tackiness may be improved by decreasing the addition amount of the crosslinking agent at the time of synthesizing the adhesive agent by a polymerization method; adding a tackifier; modifying an end group of the molecule; or the like. Further, even when the same adhesive agent is used, the adhesiveness may be improved by modifying a surface to which the adhesive agent is bonded, namely, a surface of a transparent plastic film or a glass plate. Examples of the method of surface modifying include physical processes such as a corona discharge process or a plasma glow process, and a process of forming a primer layer for improving the adhesiveness.

The method of forming the scattering member using an adhesive agent for an organic EL display device is not particularly restricted, and known examples include a method of coating a solution of the adhesive agent on an organic EL display device and irradiating the adhesive agent with UV-rays. The thickness of the adhesive layer is not particularly restricted, but a dry film thickness is preferably in the range of about 0.1 to 40.0 µm, more preferably in the range of about 0.5 to 10.0 µm, and most preferably in the range of about 1.0 to 7.5 µm.

Examples of the transparent resin that may be used include the following three kinds of resin, namely, resins that are cured by UV-rays or electron beams, that is, ionizing radiation curable resins; mixtures of the ionizing radiation curable resin, a thermoplastic resin and a solvent; and thermosetting resins.

The transparent resin is preferably a polymer having saturated hydrocarbon or polyether as a main chain, more preferably a polymer having saturated hydrocarbon as a main chain. The binder is preferably crosslinked. The polymer having saturated hydrocarbon as a main chain is preferably obtained by a polymerization reaction of ethylenically unsaturated monomer. A monomer having at least two ethylenically unsaturated groups is preferably used to obtain a crosslinked binder.

Examples of the monomer having at least two ethylenically unsaturated groups include esters of polyhydric alcohol and (meth)acrylic acid (such as ethylene glycol di(meth)acrylate, 1,4-cyclohexane diacrylate, pentaerythritol tetra(meth)acrylate, pentaerythritol tri(meth)acrylate, trimethylolpropane tri(meth)acrylate, trimethylolethane tri(meth)acrylate, dipentaerythritol tetra(meth)acrylate, dipentaerythritol penta(meth)acrylate, dipentaerythritol hexa(meth)acrylate, 1,3,5-cyclohexanetriol trimethacrylate, polyurethane polyacrylate and polyester polyacrylate), derivatives of vinyl benzene (such as 1,4-divinyl benzene, 4-vinyl benzoate-2-acryloyl ethyl ester and 1,4-divinyl cyclohexanone), vinyl sulfones (such as divinyl sulfone), acrylamides (such as methylene his-acrylamide) and methacrylamides. Among these, acrylate or methacrylate monomers having at least three functional groups and methacrylate monomers having at least five functional groups are preferred from the viewpoint of film hardness, that is, scratch resistance. Mixtures of dipentaerythritol pentaacrylate and dipentaerythritol hexaacrylate are commercially available and particularly preferably used.

The monomer having the ethylenically unsaturated group may be dissolved in a solvent together with various kinds of polymerization initiator and other additives, followed by coating and drying, further followed by polymerizing with ionizing radiation or heat to be cured.

In place of using the monomer having at least two ethylenically unsaturated groups, or in addition to the use of above monomer, a crosslinked structure may be introduced in the binder by a reaction of crosslinkable groups. Examples of the crosslinkable functional groups include an isocyanate group, an epoxy group, an aziridine group, an oxazoline group, an aldehyde group, a carbonyl group, a hydrazine group, a carboxyl group, a methylol group and an active methylene group. Vinyl sulfonic acids, acid anhydrides, cyanoacrylate derivatives, melamines, etherized methylols, esters, urethanes and metal alkoxides such as tetramethoxysilane may also be used as a monomer for introducing a crosslinked structure. A functional group showing an crosslinking ability as a result of decomposition reaction, such as a block isocyanate group, is also applicable. That is, the functional group showing a crosslinking ability may not necessarily immediate show reactivity, but may show reactivity as a result of decomposition. By applying a binder having a crosslinkable functional group and then heating, a crosslinked structure may be formed.

The transparent resin may contain, in addition to the aforementioned binder polymer, a monomer having a high refractive index. Examples of the monomer having a high refractive index include bis(4-methacryloylthiophenyl)sulfide, vinyl naphthalene, vinyl phenyl sulfide and 4-methacryloxyphenyl-4'-methoxyphenylthioether.

Examples of the solvent include ethers having 3 to 12 carbon atoms, such as dibutyl ether, dimethoxymethane, dimethoxyethane, diethoxyethane, propylene oxide, 1,4-dioxane, 1,3-dioxolane, 1,3,5-trioxane, tetrahydrofuran, anisole and phenetol; ketones having 3 to 12 carbon atoms, such as acetone, methyl ethyl ketone, diethyl ketone, dipropyl ketone, diisobutyl ketone, cyclopentanone, cyclohexanone and methylcyclohexanone; esters having 3 to 12 carbon atoms, such as ethyl formate, propyl formate, n-pentyl formate, methyl acetate, ethyl acetate, methyl propionate, ethyl propionate, n-pentyl acetate and γ-butylolactone; organic solvents having at least two kinds of functional groups, such as methyl 2-methoxy acetate, methyl 2-ethoxyacetate, ethyl 2-ethoxyacetate, ethyl 2-ethoxypropionate, 2-methoxyethanol, 2-propoxyethanol, 2-butoxyethanol, 1,2-diacetoxyacetone, acetylacetone, diacetone alcohol, methyl acetoacetate and ethyl acetoacetate. Furthermore examples of the solvent include methanol, ethanol, 1-propanol, 2-propanol, 1-butanol, 2-butanol, tert-butanol 1-pentanol, 2-methyl-2-butanol, cyclohexanol, isobutyl acetate, methyl isobutyl ketone, 2-octanone, 2-pentanone, 2-hexanone, 2-heptanone, 3-pentanone, 3-heptanone and 4-heptanone. These may be used alone or in combination of two ore more.

The transparent resin may be coated on the passivation layer, second electrode or color filter layer of the organic EL display, by use of a bar coater or a spin coater.

As a method of curing the ionizing radiation-curable resin composition as mentioned above, a usual method of curing the ionizing radiation-curable resin composition with electron beams or UV-rays may be applied.

In the case of using electron beams for the curing, electron beams having an energy of 50 to 1000 KeV, preferably from 100 to 300 KeV emitted from various kinds of electron accelerators are used. Examples of the electron accelerator include a Cockcroft-Walton accelerator, a Van de Graaff accelerator, a resonant transforming accelerator, an insulating core-transforming accelerator, a linear accelerator, a dinamitron accelerator and a radio-frequency accelerator In the case of using UV-rays for the curing, UV-rays emitted from various kinds of light sources such as an ultrahigh-pressure mercury lamp, a high-pressure mercury lamp, a low-pressure mercury lamp, a carbon arc lamp, a xenon arc lamp and a metal halide lamp may be used.

The thickness of the scattering member including a transparent resin as a binder is preferably in the range of about 0.1 to 40.0 µm, more preferably 0.5 to 10.0 µm and most preferably 1.0 to 7.5 µm.

The binder may contain ultrafine particles of metal oxide having high refractive index in addition to the foregoing material. Examples of the high refractive index metal oxide ultrafine particles include fine particles having a particle diameter of 100 nm or less, preferably of 50 nm or less, that are made of at least one selected from oxides of zirconium, titanium, aluminum, indium, zinc, tin and antimony. Preferable examples of the high refractive index metal oxide ultrafine particles include ultrafine particles of at least one kind of oxide of metal selected from Al, Zr, Zn, Ti, In and Sn. Specific examples thereof include $Zr_2$, $TiO_2$, $Al_2O_3$, $In_2O_3$, ZnO, $SnO_2$, $Sb_2O_3$ and ITO. Among these, $ZrO_2$ is particularly preferable. The addition amount of high refractive index monomer or metal oxide ultrafine particles is preferably in the range of 10 to 90 mass %, more preferably in the range of 20 to 80 mass % in the total mass of the transparent resin.

The binder may contain low refractive index ultrafine particles in addition to the above materials. Examples of the low refractive index ultrafine particles include silica fine particles having a particle diameter of 100 nm or less, and preferably of 50 nm or less. Furthermore, hollow silica containing air in the particle to realize even lower refractive index may be used as well. The addition amount of low refractive index ultrafine particles is preferably in the range of 10 to 90 mass %, more preferably in the range of 20 to 80 mass %, in the total mass of the transparent resin.

Light scattering particles included in the scattering member is not particularly restricted, and may be either organic fine particles or inorganic fine particles. Examples of the organic particles include polymethyl methacrylate beads, acryl-styrene copolymer beads, melamine beads, polycarbonate beads, styrene beads, crosslinked polystyrene beads, polyvinyl chloride beads and benzoguanamine-melamine formaldehyde beads. Examples of the inorganic fine particles include particles of $SiO_2$, $ZrO_2$, $TiO_2$, $Al_2O_3$, $In_2O_3$, ZnO, $SnO_2$ and $Sb_2O_3$.

The addition amount of light scattering particles in the scattering member is preferably from 1 to 40 mass %. When the above addition amount is 1 mass % or more, the light scattering propelty may be sufficient and when the addition amount is 40 mass % or less, the adhesive force may be secured.

In what was mentioned above, an example in which scattering member 17 is laminated on color filter 16 is mainly described. However; an embodiment is also preferable in which, without disposing (or in addition to) the scattering member; the aforementioned transparent image-receiving layer serving as a portion where a color filter is transferred includes a binder, light scattering particles and other optional components such as metal oxide ultrafine particles. In this case, the transparent image-receiving layer serves as the scattering member to contribute to improvements in light extraction efficiency, as well as formation of a color filter exhibiting high fineness.

When the transparent image-receiving layer includes the binder and light scattering particles, the aforementioned resin materials that may be contained in the transparent image-receiving layer may be used as the binder, in addition to the tackifier, adhesive agent or transparent resin. The content of the hinder (tackifier, adhesive agent, transparent resin or other materials) in the transparent image-receiving layer is preferably in the range of 1 to 50 mass % in the total resin content. The content of the light scattering particles in the transparent image-receiving layer is preferably in the range of 10 to 90 mass %, and more preferably in the range of 20 to 80 mass % in the total mass of transparent image-receiving layer.

A barrier film 20 may be disposed for sealing above scattering member 17, which is disposed above glass substrate 11, via an adhesive layer 18 disposed so as to cover the entire area of the laminate structure including the organic EL layer and so on. Barrier film 20 has a function of blocking oxygen and moisture in air and may include, on a side of a polyethylene naphthalate (PEN) film, an inorganic layer, an organic layer, an inorganic layer, an organic layer, an inorganic layer, an organic layer, an inorganic layer, and an adhesive layer in this order.

The barrier film is preferably a gas barrier film having a barrier layer including, on a transparent base film, an organic region and an inorganic region. More preferably, the barrier film is a gas barrier film having an organic-inorganic laminate barrier layer in which an organic layer and an inorganic layer are alternately laminated.

When the barrier film includes an organic region and an inorganic region, a so-called graded material layer in which the composition of respective regions continuously vary in a film thickness direction may be used. Examples of the graded material layer include materials described in "Journal of Vacuum Science and Technology A Vol. 23 pp. 971-977 (2005 American Vacuum Society)" and a layer having a continuous composition in which no interface is formed between an organic layer and an inorganic layer; as described in U.S. Patent Application Publication No. 2004/0046497. Hereinafter, for the purpose of simplification, the organic layer and organic region are generically referred to as "organic layer" and the inorganic layer and inorganic region are generically referred to as "inorganic layer" sometimes.

The number of layers in the gas barrier film is not particularly restricted, but preferably 2 to 30 layers and more preferably 3 to 20 layers. The barrier layer may be disposed either only on one side or on both sides of the transparent base film.

In what follows, preferable layer configurations of the gas barrier film will be described. However, the layer structure of the gas barrier film in the invention is not restricted thereto. Details of the adhesive layer, base film, organic layer and inorganic layer will be described later.

(1) Base film/organic layer/inorganic layer/adhesive layer
(2) Base film/inorganic layer/organic layer/adhesive layer
(3) Base film/inorganic layer/organic layer/inorganic layer/organic layer/adhesive layer
(4) Base film/inorganic layer/organic layer/easy-adhesive layer/adhesive layer
(5) Base film/organic layer/inorganic layer/organic layer/easy-adhesive layer/adhesive layer
(6) Release layer/antistatic layer/base film/inorganic layer/organic layer/inorganic layer/organic layer/adhesive layer In the invention, the adhesion/curing temperature of the adhesive layer is preferably lower than the glass transition temperature of the organic layer. In this case, adhesion may be performed without denaturing the organic layer.

Since the gas barrier film tends to be scratched if the inorganic layer is exposed, the surface of the gas barrier film is preferably the organic layer. When the adhesive layer is disposed as the outermost layer that is most remote from the transparent film, it may be effective to omit the organic layer positioned for inhibiting scratching. Further, when the adhesive layer is disposed, the gas barrier film can be attached to a device or the like without using all adhesive agent, thereby simplifying the process.

<Adhesive Layer>

The adhesive layer included in the gas barrier film is not particularly restricted as long as it contains an adhesive agent. In the invention, a UV-curable adhesive agent or a thermosetting adhesive agent is preferably used, and the UV-curable adhesive agent is preferred. The type of the adhesive agent is not particularly restricted, and preferable examples of the UV-curable adhesive agent include epoxy-based and acrylate-based adhesives, preferably the epoxy-based one. Preferable examples of the thermosetting adhesive agent include epoxy-based and acrylate-based ones, and the epoxy-based one is more preferred.

The adhesive layer may contain other components than the adhesive agent. Examples of such components include a filter, a moisture absorbent and a deoxidizing agent. The adhesive layer may have a function of other functional layers, such as a shock-absorbing layer and a cushioning layer.

The filler is not particularly restricted and one example is silica.

The addition amount of the filler in the adhesive layer is preferably from 1 to 50 parts by mass, and more preferably from 35 to 45 parts by mass with respect to the content of the adhesive agent. The addition amount of the filler may be changed according to the portion to be added. It is preferable that the more amount of filler is contained in the adhesive layer positioned at a non-display portion, relative to the adhesive layer positioned at a display portion. While the filler may improve the adhesiveness, it is not preferable in terms of improving transparency. However, by employing the above configuration, high adhesiveness between an organic EL display device and the gas barrier film and high transparency in the image display portion may be secured at the same time.

Barrier film 20 disposed via adhesive layer 18 in an organic EL display device is preferably formed with a gas barrier film including a desired number of organic layers and inorganic layers that are alternately laminated on a base film, and an adhesive layer on the surface on the side the organic layer is provided.

<Base Film>

The gas barrier film generally includes a transparent base film. The "transparent" refers to that the film has a light transmittance for visible light of 85% or more.

The material or thickness of the base film is not particularly restricted and may be appropriately selected depending on usage, as long as the base film can support the organic layers, inorganic layer, or the like. Examples of the base film include metal supports (such as aluminum, copper, stainless) and thermoplastic resins such as polyester resins, methacrylic resins, methacrylic acid-maleic acid copolymers, polystyrenes, transparent fluororesins, polyimide resins, fluoropolyimide resins, polyamide resins, polyamideimide resins, polyetherimide resins, cellulose acylate resins, polyurethane resins, polyether ether ketone resins, polycarbonate resins, alicyclic polyolefin resins, polyarylate resins, polyether sulfone resins, polysulfone resins, cycloolefin copolymers, fluorene ring-modified polycarbonate resins, alicyclic-modified polycarbonate resins and acryloyl compounds. Among these, aluminum and polyester resins (such as polyethylene terephthalate: PET, polyethylene naphthalate: PEN) are preferred.

The thickness of the base film is appropriately selected depending on applications without particular restriction. However, the thickness is generally in the range of 1 to 800 µm and preferably in the range of 10 to 200 µm.

Further, the base film may have a functional layer such as a transparent conductive layer or a primer layer on one side or both sides thereof. Details of the functional layer are described in paragraphs [0036] through [0038] of JP-A No. 2006-289627. Examples of the functional layers other than these include a matting agent layer, a protective layer, an antistatic layer, a smoothing layer, an adhesion improvement layer, a light shielding layer; an anti-reflection layer, a hard-coat layer, a stress release layer, an anti-fog layer, an antifouling layer and a printing layer.

<Inorganic Layer>

The inorganic layer is not particularly restricted as long as it is formed from an inorganic material and has a gas barrier property. Examples of the inorganic material generally include oxide, nitride, oxynitride, carbide and hydrate of boron, magnesium, aluminum, silicon, titanium, zinc and tin. These materials may be used as a pure substance, a mixture of two or more kinds, or a graded material layer. Among these, oxide, nitride and oxynitride of aluminum, and oxide, nitride and oxynitride of silicon are preferred. The thickness of each inorganic layer in the gas barrier film is not particularly restricted, but generally preferably in the range of 5 to 500 nm (per layer), and more preferably in the range of 10 to 200 nm (per layer).

Any known methods may be used as long as a desired film may be formed, and examples thereof include a sol-gel method, a sputtering method, a vacuum deposition method, an ion plating method and a plasma CVD method. Specifically, the methods described in Japanese Patent No. 3400324, JP-A Nos. 2002-322561 and 2002-361774 are applicable.

In particular, when forming a film from a silicon compound, formation methods such as inductively coupled plasma CVD and PDV or CVD using plasmas applied with microwaves and magnetic fields set to the electron cyclotron resonance condition are preferable, and the inductively coupled plasma CVD is most preferable. The inductively coupled plasma CVD and CVD using plasmas applied with microwaves and magnetic fields set to the electron cyclotron resonance condition (ECR-CVD) may be practiced according to the methods as described, for example in, CVD Handbook, p. 284 (1991) edited by Chemical Engineering Society. Further; the PVD using plasmas applied with microwaves and magnetic fields set to the electron cyclotron resonance condition (ECR-PVD) may be practiced, for example, by the method described in Ono et al., Jpn. J. Appl. Phys. 23, No. 8, L534 (1984). As a raw material for use in the CVD method, a gas source such as silane or a liquid source such as hexamethyl disilazane may be used as a silicon supply source.

<Organic Layer>

The gas barrier film preferably has an organic layer One or more of the organic layer may be disposed adjacent to the inorganic layer so as to improve the durability and barrier property of the inorganic layer.

The organic layer may be formed according to (1) a method of using an inorganic oxide layer prepared by a sol-gel method, or (2) a method of applying an organic substance by coating or depositing, followed by curing with UV-rays or electron beams. The methods (1) and (2) may be used in combination. For instance, after a thin film is formed on a resin film to form an inorganic oxide layer by method (1), a thin film may be formed by method (2). In what follows, the methods will be described sequentially.

(1) Sol-Gel Method

The sol-gel method is a method in which a metal alkoxide is hydrolyzed and polycondensed preferably in a solution or a coated film to obtain a dense thin film. In this process, it is also possible to form an organic-inorganic hybrid material by using a resin in combination.

Examples of the metal alkoxide used in the sol-gel method include alkoxysilane and other metal alkoxides than alkoxysilane. Preferable examples of the metal alkoxides other than the alkoxysilanes include zirconium alkoxide, titanium alkoxide and aluminum alkoxide.

The polymer for use together in the sol-gel reaction preferably has a hydrogen bond-forming group. Examples of the resin containing a hydrogen bond-forming group include polymers having a hydroxyl group and derivatives thereof (such as polyvinyl alcohol, polyvinyl acetal, ethylene-vinyl alcohol copolymers, phenol resins, methylol melamines and the derivatives thereof); polymers having a carboxyl group and derivatives thereof (such as homopolymers or copolymers containing a polymerizable unsaturated acid unit such as poly(meth)acrylic acid, maleic anhydride, or itaconic acid, and the esters of these polymers (homopolymers and copolymers containing a unit of a vinyl ester such as vinyl acetate or a (meth)acrylate ester such as methyl methacrylate), etc.); polymers having an ether bond (such as polyalkylene oxide, polyoxyalkylene glycol, polyvinyl ether and silicon resin); polymers having an amide bond (such as N-acylated compounds of polyoxazolines or polyalkylenieimines having a >N(COR)— bond, where R represents a hydrogen atom, an alkyl group that may have one or more substituents, or an aryl group that may have one or more substituents); polyvinyl pyrrolidones having a >NC(O)— bond and derivatives thereof, urethane bond-containing polyurethanes; and urea bond-containing polymers.

Further, a monomer may be used in combination during the sol-gel reaction to be polymerized during the sol-gel reaction or after reaction to prepare an organic-inorganic hybrid material.

A catalyst is preferably used during the sol-gel reaction in which the metal alkoxide is hydrolyzed and polycondensed in water or organic solvent. An acid (organic acid or inorganic acid) is generally used as a hydrolysis catalyst.

The amount of the acid to be used is from 0.0001 to 0.05 mol and preferably from 0.001 to 0.01 mol, with respect to 1 mol of metal alkoxide (in the case where alkoxysilane and other metal alkoxide are contained, alkoxysilane+other metal alkoxide). After the hydrolysis, an inorganic base or a basic compound such as amine may be added to render the pH of the solution substantially neutral to promote the polycondensation.

Other sol-gel catalysts such as metal chelate compounds having Al, Ti or Zr as a center metal, organometallic compounds such as compounds of tin, or metal salts such as an alkali metal salt of an organic acid may be used together.

A ratio of the sol-gel catalyst in the composition is preferably from 0.01 to 50 mass %, more preferably from 0.1 to 50 mass % and still more preferably from 0.5 to 10 mass %, with respect to the alkoxysilane as a raw material for a sol solution.

In the next place, solvents used in the sol-gel reaction will be described.

The solvent is used for uniformly mixing respective components in a sol solution to control the solid content in the composition and make it applicable to various kinds of coating methods, thereby improving the dispersion stability and storage stability of the composition. The solvent is not particularly restricted as long as the above purposes can be achieved. Examples of the preferable solvent include water and an organic solvent having a high miscibility with water.

In order to control the speed of sol-gel reaction, an organic compound having an ability of forming multidentate coordination may be added to stabilize the metal alkoxide. Examples of the organic compound having an ability of forming multidentate coordination include β-diketone and/or β-ketoesters and alkanol amines.

Specific examples of the β-diketone compounds and/or β-ketoester compounds include acetylacetone, methyl acetoacetate, ethyl acetoacetate, n-propyl acetoacetate, i-propyl acetoacetate, n-butyl acetoacetate, sec-butyl acetoacetate, tert-butyl acetoacetate, 2,4-hexane-dione, 2,4-heptane-dione, 3,5-heptane-dione, 2,4-octane-dione, 2,4-nonane-dione and 5-methyl-hexane-dione. Among these, ethyl acetoacetate and acetylacetone are preferred, and acetylacetone is particularly preferred. The β-diketone compounds and/or β-ketoester compounds may be used alone or in combination of two or more kinds thereof.

The organic compound having an ability of forming multidentate coordination may be used to control the reaction speed when the aforementioned metal chelate compound is used as a sol-gel catalyst.

In the next place, a method of coating a sol-gel reaction composition will be described.

A sol solution is formed into a thin film on a transparent film by use of a coating method such as curtain flow coating, dip coating, spin coating or roll coating. In this case, the hydrolysis may be conducted at any time during the producing process. For instance, a method of preparing a composition containing necessary components by conducting hydrolysis and partial condensation, and then coating and drying the composition; and a method of preparing the composition containing necessary components, and then coating and drying it simultaneously with the process of hydrolysis and partial condensation; and a method of preliminary coating and drying the composition, and further applying an aqueous composition containing components necessary for hydrolysis and conducting the hydrolysis.

The coating method is not particularly restricted but considering productivity, a simultaneous multilayer coating method is preferably used in which a multilayer stream is formed and continuously applied onto a support and dried, the multilayer stream being formed from an upper-layer composition and a lower-layer composition on a slide geeser having a multi-stage ejection slit by controlling the discharge amount of the compositions so that the necessary amount of each composition can be maintained.

The drying temperature after the coating is preferably from 150 to 350° C., more preferably from 150 to 250° C. and still more preferably from 150 to 200° C.

Irradiation with energy rays may be conducted in order to increase the density of the film after coating and drying. The type of irradiation rays is not particularly restricted, but considering the influences on deformation or denaturing of a support, UV-rays, electron beams or microwaves are particularly preferably used. The irradiation intensity is from 30 to 500 mJ/cm$^2$ and particularly preferably from 50 to 400 mJ/cm$^2$. The irradiation temperature may any point between room temperature and a deformation temperature of the support without particular restriction, but is preferably from 30 to 150° C. and particularly preferably from 50 to 130° C.

(2) Method of curing organic layer formed by coating or deposition with UV-rays or electron beams A method of forming an organic layer mainly composed of a polymer obtained by crosslinking a monomer will be described. The monomer used in this method is not particularly restricted as long as it has a group that can be crosslinked with the use of UV-rays or electron beams, but a monomer having an acryloyl group, methacryloyl group or oxetane group is preferably used. For example, a polymer obtained by crosslinking a difunctional monomer or higher having an acryloyl group or methacryloyl group selected from epoxy (meth)acrylate, urethane(meth)acrylate, isocyanuric acid (meth)acrylate, pentaerythritol(meth)acrylate, trimethylolpropane(meth)acrylate, ethylene glycol(meth)acrylate and polyester(meth)acrylate is preferably used as a main component. Two or more kinds of monomers that is difunctional or more having an acryloyl group or methacryloyl group may be used in combination, or a monofunctional (meth)acrylate may be used in combination.

As the monomer having an oxetane group, monomers having a structure described in formulae (3) through (6) of JP-A No. 2002-356607 are preferably used. In this case, these monomers may be used alone or in combination.

Further, the polymer is preferably mainly composed of isocyanuric acid acrylate, epoxy acrylate or urethane acrylate, which monomers having a high crosslinking ability and a glass transition temperature of 200° C. or more, from the viewpoint of heat resistance and solvent resistance. The thickness of the organic layer is preferably from 10 to 5000 nm, more preferably from 10 to 2000 nm and most preferably from 10 to 500 nm without particular restriction. When the thickness of the organic layer is 10 nm or more, the layer may have a uniform thickness, thereby effectively filling the structural defects in the inorganic layer with the organic layer and improving the barrier property. When the thickness is 5000 nm or less, the organic layer may be less prone to cracking due to an external force such as bending, thereby achieving an excellent barrier property.

Examples of method of forming the organic layer include a coating method and a vacuum deposition method. The vacuum deposition method is not particularly restricted, but preferably a deposition method such as a vapor deposition method or a plasma CVD method and more preferably a resistance heating vapor deposition method in which the deposition speed of an organic material monomer can be readily controlled. The method of crosslinking the monomer is not particularly restricted, but preferably conducted with electron beams or IV-rays from the viewpoint of easily putting the monomer in a vacuum chamber or rapidly increasing the molecular weight by crosslinking reaction.

When the formation is conducted by a coating method, various kinds of existing coating methods such as spray coating, spin coating or bar coating may be used.

The gas barrier film may include, other than the layers as mentioned above, a desired functional layer between the base film, organic layer and inorganic layer, between the gas barrier film and adhesive agent layer, or on the outermost side of the film. Examples of such functional layers include a smoothing layer, an adhesiveness improving layer and an anti-reflection layer.

The moisture permeation rate of the gas barrier film at 40° C. and 90% relative humidity is preferably 0.01 g/m$^2$·day or less, more preferably 0.001 g/m$^2$·day or less and particularly preferably 0.0001 g/m$^2$·day or less.

Furthermore, the thickness of the gas barrier film is preferably from 10 to 500 μm and more preferably from 50 to 250 μm.

The base film used in the gas barrier film may include a functional layer such as a transparent conductive layer or a primer layer on one side or both sides thereof, Details of the functional layer are described in paragraphs [0036] through [0038] of JP-A No. 2006-289627. Examples of other functional layers than the above include a matte agent layer, a protective layer, an antistatic layer, a smoothing layer, an adhesiveness improvement layer, a light shielding layer, an anti-reflection layer, a hardcoat layer, a stress relieve layer, an anti-fog layer, an antifouling layer and a printing layer. These films may be laminated with an easy-releasable protective film. Examples of the protective film include polyethylene and polypropylene.

A hardcoat layer 21 may be disposed above barrier film 20, as shown in FIG. 1. In the hardcoat layer, an active ray-curable resin (active-ray curable resin layer) or a thermosetting resin is preferably used.

The active ray-curable resin layer refers to a layer mainly composed of a resin that is cured by crosslinking reaction upon irradiation with active light such as UV rays or electron beams. Typical active light-curable resins include UV-curable resins and electron beam-curable resins, but resins cured upon irradiation with other active rays than UV-rays and electron beams may also be used. Examples of the UV-curable resin include UV-curable acryl urethane resins, UV-curable polyester acrylate resins, UV-curable epoxy acrylate resins, UV-curable polyol acrylate resins and UV-curable epoxy resins.

The UV-curable acrylic urethane resin are generally readily obtained by preparing a product by reacting polyester polyol with an isocyanate monomer or prepolymer, and then further reacting the product with an acrylate monomer having a hydroxyl group such as 2-hydroxyethyl acrylate, 2-hydroxyethyl methacrylate (hereinafter, the term "acrylate" may include methacrylate sometimes) or 2-hydroxypropyl acrylate. Examples of such resins are described in, for instance, JP-A No. 59-151110.

The UV-curable polyester acrylate resin is generally readily obtained by reacting polyester polyol with 2-hydroxyethyl acrylate or 2-hydroxy acrylate monomer; and examples of such resins are described in, for instance, JP-A No. 59-151112.

Specific examples of UV-curable epoxy acrylate resin include those that are obtained by adding a reactive diluent and a photopolymerization initiator to epoxy acrylate in oligomers, and then bring it to reaction. Examples of such resins are described in, for instance, JP-A No. 01-105738.

The photopolymerization initiators may be one or more selected from benzoin derivatives, oxime ketone derivatives, benzophenone derivatives and thioxanthone derivatives.

Specific examples of UV-curable polyol acrylate resin include trimethylolpropane triacrylate, ditrimethylolpropane tetraacrylate, pentaerythritol triacrylate, pentaerythritol tetraacrylate, dipentaerythritol hexaacrylate and alkyl-modified dipentaerythritol pentaacrylate. The resins are usually used in combination with a known photosensitizer.

The aforementioned photopolymerization initiator may also be used as a photosensitizer, and specific examples include acetophenone, benzophenone, hydroxybenzophenone, Michller's ketone, α-amyloxime ester, thioxanthone and derivatives thereof. When an epoxy acrylate photoreaction agent is used, a sensitizer such as n-butylamine, triethylamine or tri-n-butyl phosphine may be used.

The content of photopolymerization initiator or photosensitizer in the UV-curable resin composition without a solvent component that volatilizes after the coating and drying is particularly preferably from 2.5 to 6 mass % of the composition. wllen the content is 2.5 mass % or more, inhibition of curing due to a plasticizer and/or a UV-absorbent that elutes from the resin film may be suppressed to maintain favorable scratch resistance, and when the content is 6% by weight or less, the relative amount of UV-curable resin component does not decrease too much, thereby suppressing degradation of scratch resistance or coating ability to maintain favorable surface quality of the coating.

The resin monomers include, for instance, general monomers having one unsaturated double bond such as methyl acrylate, ethyl acrylate, butyl acrylate, vinyl acetate, benzyl acrylate, cyclohexyl acrylate and styrene, and monomers having at least two unsaturated double bonds such as ethylene glycol diacrylate, propylene glycol diacrylate, divinyl benzene, 1,4-cyclohexane diacrylate, 1,4-cyclohexyl dimethyl diacrylate, the above-mentioned trimethylolpropane triacrylate and pentaerythritol tetraacrylate.

The solid component concentration of the active ray-curable resin in the coating composition is preferably from 10 to 95 mass % and an appropriate concentration may be selected depending on the coating method.

The light source used for forming a cured film layer from the active ray-curable resin by photocuring reaction may be any light source that emits active rays. Examples of the light source include a low-pressure mercury lamp, a medium-pressure mercury lamp, a high-pressure mercury lamp, an ultra-high-pressure mercury lamp, a carbon arc lamp, a metal halide lamp and a xenon lamp. Although the conditions for irradiation may be different depending on the type of respective lamps, the irradiation light amount may be in the range of 20 to 10000 mJ/cm$^2$ and preferably in the range of 50 to 2000 mJ/cm$^2$. A sensitizer having absorption maximum in a region from near UV-region to visible ray region is used. The UV irradiation may be conducted one or more times.

The solvent used for the formation of the active ray-curable resin layer may be one or more appropriately selected from the solvents that may be used for the formation of the aforementioned resins layer such as hydrocarbons, alcohols, ketones, esters, glycol ethers and other solvents. A solvent containing propylene glycol monoalkyl ether (1 to 4 carbon atoms) or propylene glycol monoalkyl ether ester (1 to 4 carbon atoms) in an amount of 5 mass % or more, preferably from 5 to 80 mass %, is preferably used.

The coater used for the application of a coating solution for the active ray-curable resin layer may be any known device such as a gravure coater, a spinner coater, a wire bar coater, a roll coated; a reverse coater; an extrusion coater or an air doctor coater. The coating amount is preferably from 0.1 to 200 µm and preferably 0.5 to 100 µm in wet film thickness. The coating speed is preferably from 5 to 200 m/min. When the film thickness is thick, the coating process may be conducted twice or more to form a transparent hardcoat layer. The UV-curable resin composition is irradiated with UV-rays by a light source after the coating and drying. The irradiation time is preferably from 0.5 sec to 5 min and more preferably from 3 sec to 2 min, from the viewpoint of curing efficiency of the UV-curable resin and operation efficiency.

The film thickness upon drying of the obtained hardcoat layer is preferably from 0.2 to 100 µm, more preferably from 1 to 50 µm and particularly preferably from 2 to 45 µm.

Organic or inorganic fine particles described above may be added in order to impart slipperiness to the layer. Further the matting agent as described above may also be used. Further, as described above, the active ray-curable resin layer may also be formed on a resin layer such as an antistatic layer. The antistatic layer or the transparent hard coat layer may be provided atone or in lamination. Specifically the hardcoat layer may be formed directly or through a primer layer on one surface of an antistatic-treated optical film, a polarization plate protective film, or a cellulose acylate film, which films are described, for example, in JP-A Nos. 6-123806, 9-113728, and 9-203810.

The luminescent device of the invention may be produced, as mentioned above, by a method of forming a device structure including a color filter that is directly formed on an array side of a substrate having an EL layer thereon, and preferably produced according to the following process.

The method of producing a luminescent device of the invention includes a process of forming a color filter (hereinafter; referred to as "color filter forming process" sometimes) as described below.

Specifically, the color filter forming process includes positioning a thermal transfer sheet onto a device substrate having an EL layer on a substrate. The thermal transfer sheet includes a photothermal conversion layer that converts laser light to heat and a thermal transfer layer containing a colorant, on a support in this order.

In the above process, the thermal transfer sheet is positioned so that the thermal transfer layer contacts (1) the EL layer formed on the substrate (i.e., on a second electrode, passivation layer or transparent image-receiving layer) or (2) the surface of the substrate.

Thereafter, a predetermined portion of the thermal transfer sheet is irradiated with laser light from the support side, then the portion of the thermal transfer layer that has been irradiated with laser light is transferred to (1) the EL layer or (2) the surface of the substrate.

When the thermal transfer layer is transferred to (1) the EL layer, a top-emission organic EL display device, such as the one shown in FIG. 1, may be prepared. When the thermal transfer layer is transferred to (2) the surface of the substrate, a bottom-emission EL display device, such as the one shown in FIG. 5, may be prepared.

In the invention, a color filter layer is disposed by transferring directly on an electroluminescent layer formed on a substrate of device substrate, or on a surface of the substrate. Accordingly, there are such advantages that the progress of degradation of organic EL layer due to moisture caused in a wet process may be avoided; and positional alignment may be readily conducted when bonding an array-side substrate that serves as a display device with a sealing substrate, thereby alleviating the restriction on dimensional precision. For instance, it becomes possible to use a resin film for the above two substrates in place of a glass substrate that has been conventionally used, thereby realizing the reduction in weight or thickness of the device.

That is, it has been common to dispose luminescent pixels for display on an array side and a color filter on a seating side. In this case, however, it has been impossible in principle to conduct alignment when deformation of the two substrates is in an irregular manner (e.g., trapezoidal shape). In the invention, it is possible to form a color filter positioned according to the position of pixels even when the substrates are deformed in an irregular manner, by providing a number of alignment marking on the array-side substrate or using the pixels as the alignment markings. Accordingly, dimensional precision requirements for the array-side substrate may be reduced, thereby enabling selection of the material from more choices such as a film substrate. In this case, in addition to the reduction in weight or thickness of the device, there is also an effect of preventing injury caused by accidental glass breaking. Further; since the whole device can be deformed to have a curved surface or the like, it may be possible to realize various kinds of embodiments that have not been able to be achieved in a conventional device, such as disposing a display or illumination device around a round pillar or suspending it from a ceiling in the form of a drop curtain.

In the method of producing the luminescent device of the invention, the thermal transfer layer of the laser thermal transfer sheet in contact with (1) the electroluminescent layer or (2) the substrate as mentioned above is irradiated with laser light from a support side of the laser thermal transfer sheet in conformity with predetermined positions (such as pixel positions) on a device substrate to generate heat in an irradiated region. The thermal transfer layer is brought into close contact with (1) the electroluminescent layer such as a surface of transparent resin layer 15 in FIG. 1 or a surface of passivation layer 14 in FIG. 3, or (2) a surface of transparent resin layer 35 in FIG. 5 or a surface of a glass substrate or barrier film 31 in FIG. 6, by means of heat. The thermal transfer sheet is then removed and transferred.

When the thermal transfer layer of laser thermal transfer sheet is irradiated with laser light from the backside of the sheet while contacting the thermal transfer layer to the adherend, the irradiated portion of photothermal converting layer generates heat to closely contact the thermal transfer layer to the adherend. Additionally, for example, a thermal releasing layer irradiated with laser light decomposes or the like by heat to become easy-releasable, thereby reducing the adhesion between the thermal transfer layer and the photothermal converting layer at the irradiated portion relative to the adhesion between the thermal transfer layer and the photothermal converting layer at the non-irradiated portion. In this case, when the laser thermal transfer sheet is removed to release the thermal transfer layer from the adherend, irradiated portion of the thermal transfer layer is transferred to the adherend. The transfer is conducted by a film transfer method shown in FIG. 4D in which heating and releasing is conducted while contacting the thermal transfer layer to the adherend. In terms of obtaining a sharp image, the thermal transfer layer is particularly preferably transferred to (1) a surface of transparent image receiving layer 15 in FIG. 1 or (2) a surface of transparent resin layer 35 in FIG. 5. According to this method, it is possible to form an image having a shape edge. In particular, a pattern image having a pixel size of 100×100 µm or less may be effectively formed.

Methods of disposing the thermal transfer sheet onto an adherend such that the thermal transfer layer contacts the adherend include those employing vacuum suctioning, electrostatic suctioning or adhesion force.

The irradiation with laser light may be conducted in a manner similar to existing methods, i.e., a method in which the thermal transfer sheet is irradiated with laser light from the backside thereof while contacting the thermal transfer layer of thermal transfer sheet with an adherend such as a transparent image-receiving layer (hereinafter; this structure is referred to as a "laminate" sometimes) is applied. The irradiation may be conducted by a fixed exposure head and an exposure stage onto which an array-side substrate having an EL layer is mounted and fixed (the exposure stage may have a vacuum-forming unit inside thereof and a number of fine openings on the surface for fixing the substrate by evacuating) that can move in an X-Y direction, so that main-scanning is performed in a main-scanning direction while the exposure stage moves in a sub-scanning direction (sub-scanning) at a constant rate at each main-scanning.

Figure 7A:
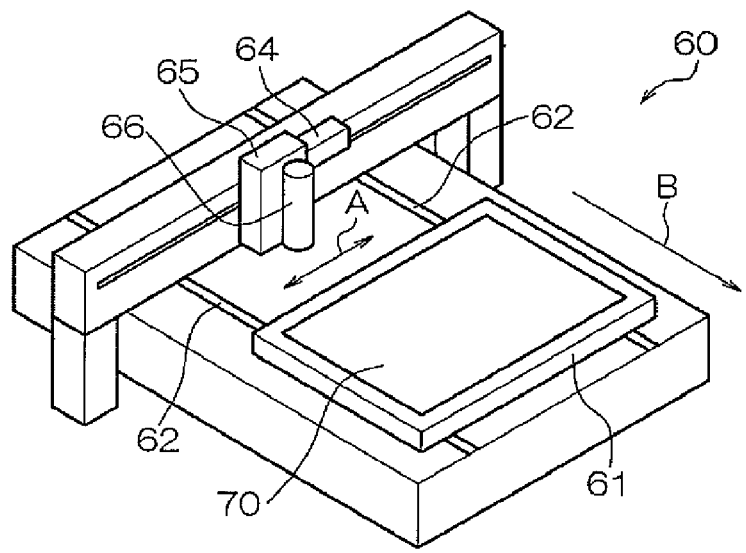
FIG. 7A is a perspective view showing an example of a laser exposure unit used in the formation of a color filter layer.

For instance, the irradiation may be conducted by a laser exposure unit 60 as shown in FIG. 7A including a suction stage 61 that fixes the substrate (laminate) by suctioning (for example, vacuum-suctioning by a vacuum-forming unit provided inside to evacuate by a number of fine openings in the surface of the stage onto which the substrate is placed), a laser unit 64 having a semiconductor laser, a laser head assembly 65 that can irradiate the laminate with laser light, and a CCD camera unit 66 that is fixed to the laser head assembly.

Figure 7B:
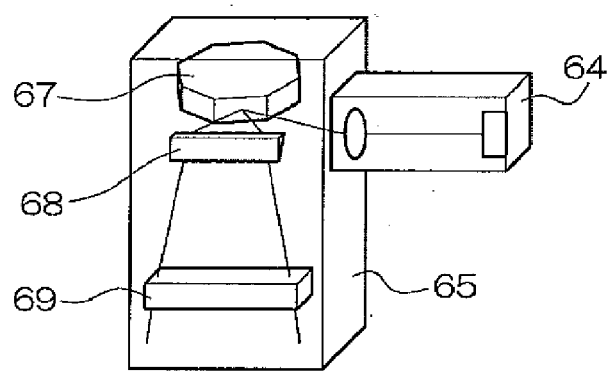
FIG. 7B is a perspective view showing a laser head unit of FIG. 7A.

As suction stage 61 to which the laminate is fixed moves in a direction of an arrow B along a linear guide 62 at a constant speed, CCD camera unit 66 records, on its outward route, an image of EL layer electrode layer, TFT layer or the like in the proximity of a plurality of predetermined reference image patterns from a back side of the thermal transfer sheet of the laminated body, detects pattern images having a shape corresponding to the reference image patterns to obtain positional coordinates thereof then converts the bit-mapped exposure data to coordinates by calculating the positional, dimensional or angular gap by comparing with coordinates of predetermined reference image patterns. On the route in the opposite direction to the above, laser head assembly 65 performs laser exposure in accordance with the converted exposure data. Laser head assembly 65 and CCD camera unit 66 are attached to a rail that is positioned so that the longer side thereof is orthogonal to a moving direction (a direction of arrow B) of the suction stage, and are movable in a direction of an arrow A in the drawing. In laser head assembly 65, as shown in FIG. 7B, laser light that has been oscillated by a laser unit 64 is reflected by a multifaceted polygon mirror 67 that is rotated at a constant rate through a lens, at a predetermined angle towards an fθ lens 69 through a mirror 68, so that the laser light can be radiated to a laminate 70 on the suction stage.

Figure 7C:
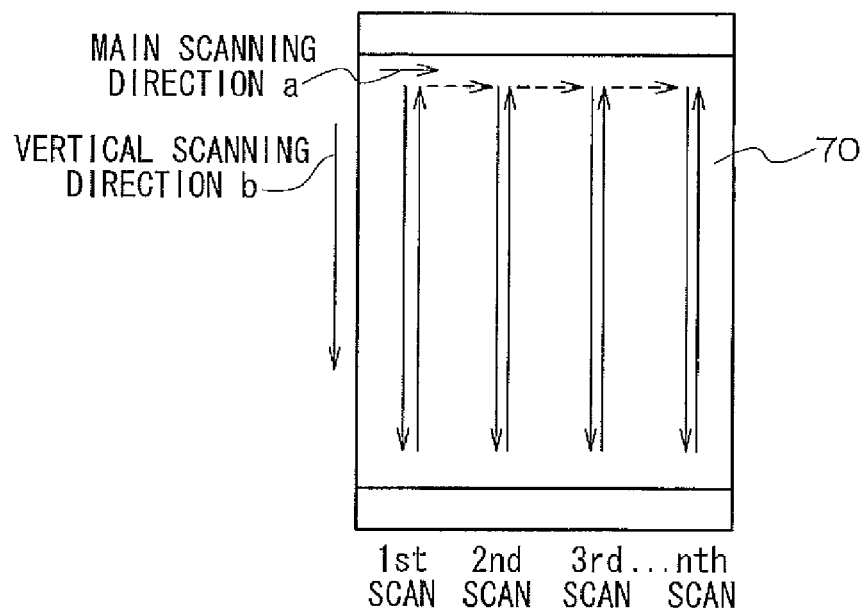
FIG. 7C is an explanatory diagram for explaining an example of a laser scanning method.

At this time, as shown in FIGS. 7A and 7C, CCD camera unit 66 records an image of pixel pattern of EL layer or the like from the backside of the thermal transfer sheet while moving in an direction of arrow B from a predetermined start point at a constant speed. After the recording, laser exposure is performed by main-scanning with laser beams at high speed in a direction shown by "a" (main-scanning direction) while moving back from a predetermined point around which the recording has been completed in a direction of arrow A. At that time, the laser is ON/OFF-controlled in accordance with converted exposure data corresponding to coordinate positions to be exposed by the beam. The speed of sub scanning in a direction shown by "b" is synchronously controlled such that the pitch between two rounds of the main scanning in a direction of "a" is constant. The pitch between the scanning in a sub-scanning direction of "b" is preferably not more than a beam diameter, more preferably not more than ⅕ of the beam diameter. The beam diameter here refers to a half-value diameter, that is, a full width at half maximum at a position where the value is half the maximum peak value. Finally, after the exposure (first scanning) has been completed, laser head assembly 65 and CCD camera unit 66 are moved by a predetermined distance in a direction of arrow A of FIG. 7A, and image recording and laser exposure are similarly performed in a main scanning direction "a" and a sub-scanning direction "b" to perform a second scanning, followed by continuing a third scanning, a fourth scanning, . . . and an n-th scanning.

As the laser light, gas laser light such as argon ion laser light, helium neon laser light or helium cadmium laser light; solid laser light such as YAG laser light; or direct laser light such as semiconductor laser light, dye laser light or excimer laser light may be used. Alternatively, light that has been converted to have a wavelength that is one half the laser light by letting through a second harmomic wave element maybe used as well. Among these, the semiconductor laser is preferred from the viewpoint of output power or easiness of modulation. When the image forming method is performed, the laser light is preferably irradiated under the conditions where a beam diameter (half-value diameter) at the photothermal conversion layer may be in the range of 3 to 50 µm (6 to 30 µm in particular) and at a scanning speed of preferably 0.1 m/sec or more (3 m/sec or more, in particular).

Herein, the thermal transfer sheet will be described.

The thermal transfer sheet includes a photothermal conversion layer that converts laser light to heat and a thermal transfer layer containing a colorant in this order on a support having a transparency in a laser wavelength region. Tile thermal transfer sheet preferably has a thermal release layer, and may further have other layers as required.

The support may be formed from various kinds of materials according to usage without particular restriction. Examples of preferable materials of the support include a sheet made of synthetic resin material such as polyethylene terephthalate, polyethylene-2,6-naphthalate, polycarbonate, polyethylene, polyvinyl chloride, polyvinylidene chloride, polystyrene and styrene-acrylonitrile copolymer. Among these, biaxially stretched polyethylene terephthalate is preferred from the viewpoint of the mechanical strength and dimensional stability to heat. The support of the thermal transfer sheet is preferably formed from a transparent synthetic resin material that transmits its laser light.

The support is preferably subjected to surface activation treatment and/or provided with at least one primer layer in order to improve the adhesiveness between the support and photothermal conversion layer disposed thereon. Examples of the surface activation treatment include glow discharge treatment and corona discharge treatment. The material of the primer layer preferably exhibits high adhesiveness to both surfaces of the support and photothermal conversion layer, small thermal conductivity, and high heat resistance. Examples of the material for the primer layer include styrene, styrene-butadiene copolymer and gelatin. The thickness of the primer layer (thickness of the whole primer layer) is usually selected from the range of 0.01 to 2 μm. Further, on a surface of the thermal transfer sheet opposite to the photothermal conversion layer side, various kinds of functional layers such as an anti-reflective layer may be disposed or a surface treatment may be conducted, as required.

The photothermal conversion layer generally has a fundamental configuration including a binder and a light absorption material (such as dye or pigment) capable of absorbing laser light. That is, when only a laser light absorption property is required, the binder does not need to be included. However, since an image forming method normally includes a step of bonding the photothermal conversion layer with a transparent image-receiving layer or releasing from the transparent image-receiving layer, a binder is usually used in combination in order to maintain sufficient self-shape retention property and adhesiveness to the support and photothermal conversion layer even in the aforementioned step. However, when the photothermal conversion layer is formed from a metal deposition film as described below, a binder may not be necessary.

Examples of the dye and pigment include black pigments such as carbon black; pigments having a large ring structure that exhibit an absorption in a visible to infrared region such as phthalocyanine and naphthallocyanine; organic dyes used as a laser absorption material for high-density laser recording of an optical disc or the like (cyanine dyes such as indolenine dye, anthraquinone dyes, azulene pigments, phthalocyanine dye); and organometallic compound dyes such as dithiol nickel complex. The photothermal conversion layer is preferably as thin as possible in order to enhance recording sensitivity. Therefore, cyanine dyes or phthalocyanine dyes that exhibit a large absorption coefficient in a laser light wavelength region are desirably used. As the laser light absorption material for the photothermal conversion layer, inorganic materials such as metals may be used as well. The metal materials may be in the form of particles (such as blackened silver) and form a layer together with a binder, or may form a deposited film on the substrate. Alternatively, the photothermal conversion layer may be formed by heating an organometallic compound such as silver behenate in the presence of a reducing agent in a solution or a film, so as to precipitate metal fine particles in situ.

Examples of the binder for the photothermal conversion layer include, without particular restriction, homopolymers or copolymers of acrylic acid monomers such as acrylic acid, methacrylic acid, acrylic acid ester and methacrylic acid ester; cellulose polymers such as methyl cellulose, ethyl cellulose and cellulose acetate; polystyrenes; vinyl polymers and copolymers of vinyl compound such as vinyl chloride-vinyl acetate copolymers, polyvinyl pyrrolidone, polyvinyl butyral and polyvinyl alcohol; condensed polymers such as polyester and polyamide; rubber-based thermoplastic polymers such as butadiene-styrene copolymers; and polymers obtained by polymerizing and crosslinking photopolymerizable or thermally polymerizable compound such as epoxy compounds.

As the other binder than the ones mentioned above, polyamide acid is also preferred.

The photothermal conversion layer is heated to a significantly high temperature upon irradiation with laser in the image forming method. When a thermal releasing layer (layer containing a heat-sensitive material that generates a gas by reaction of heat generated ill the photothermal conversion layer) is disposed on the photothermal conversion layer, the photothermal conversion layer with an elevated temperature transmits heat to the thermal releasing layer, which heat induces decomposition of a heat-sensitive material in the thermal releasing layer, thereby generating a gas or adhesive moisture. This process serves to weaken the bonding strength between the photothermal conversion layer and the thermal transfer layer. Accordingly, in the case where a separate thermal releasing layer is disposed, the binder in the photothermal conversion layer desirably has a heat resistance that is higher than that of the heat-sensitive material in the thermal releasing layer. That is, the thermal deformation temperature and thermal decomposition temperature of the binder in the photothermal conversion layer are preferably higher than those of the heat-sensitive material in the thermal releasing layer.

Alternatively, in the case where the photothermal conversion layer includes a heat-sensitive material so as to serve also as the thermal releasing layer; the beat-sensitive material in the photothermal conversion layer is decomposed to generate a gas or adhesive moisture upon heating of the photothermal conversion layer. This process serves to weaken the bonding strength between the photothermal conversion layer and the thermal transfer layer. When the photothermal conversion layer includes a colorant (dye or pigment) and a binder, the weight ratio of solid content is preferably from 1:20 to 2:1 (colorant: binder), more preferably from 1:10 to 2:1. When the amount of binder is too small, the cohesive force of photothermal conversion layer may decrease and, as the result, the formed image may be easily transferred to an image-receiving sheet together, causing color mixing in the image. On the other hand, when the amount of binder is too much, the layer thickness of the photothermal conversion layer needs to be increased so as to achieve a certain level of optical absorption, thereby easily causing reduction in sensitivity. The thickness of photothermal conversion layer including a colorant and a binder is generally in the range of 0.03 to 2 μm, preferably in the range of 0.05 to 1 μm, and more preferably in the range of 0.1 to 0.8 μm. The photothermal conversion layer preferably has an optical absorption of 70% or more in a wavelength of laser light used for optical recording.

The photothermal conversion layer may contain a heat-sensitive material that generates a gas by the action of heat generated in the photothermal conversion layer. Examples of the heat-sensitive material include a compound (polymer or low-molecular compound) that can be thermally decomposed or denatured to generate a gas by itself, or a compound (polymer or low-molecular compound) that is absorbing or adsorbing a certain amount of readily-vaporizable gas such as moisture. These compounds may be used alone or in combination. Examples of the polymer that can be thermally decomposed or denatured to generate a gas include self-oxidizing polymers such as nitrocellulose; halogen-containing polymers such as chlorinated polyolefin, chlorinated rubber, polychlorinated rubber, polyvinyl chloride and polyvinylidene chloride; acrylic polymers such as polyisobutyl methacrylate to which a volatile compound such as moisture is adsorbed;

cellulose ester such as ethyl cellulose to which a volatile compound such as moisture is adsorbed; and natural high-molecular compounds such as gelatin to which a volatile compound such as moisture is adsorbed. Examples of the low-molecular compound that can be thermally decomposed or denatured to generate a gas include a compound that generates a gas upon exothermic decomposition such as a diazo compound and an azide compound. The decomposition or denaturing due to heat of the heat-sensitive material as mentioned above preferably occurs at 280° C. or less, and particularly preferably at 230° C. or less.

The photothermal conversion layer may contain a thermal releasing layer containing a heat-sensitive material that generates a gas by the action of heat generated in the photothermal conversion layer Examples of the heat-sensitive material include compounds (polymers or low-molecular compounds) that can be thermally decomposed or denatured by itself to generate a gas, or compounds (polymers or low-molecular compounds) that is absorbing or adsorbing a certain amount of readily-vaporizable gas such as moisture may be used. These compounds may be used alone or in combination. Examples of the heat-sensitive material in the thermal releasing layer that generates a gas by the action of heat generated in the photothermal conversion layer are same as those described above. In the case of using a low-molecular compound as the heat-sensitive material in the thermal releasing layer, it is desirably combined with a binder. The binder in this case may be a polymer that can be thermally decomposed or denatured to generate a gas, or may be a polymer having such a characteristic. In the case where the heat-sensitive low-molecular compound and the binder are used together, the weight ratio of preferably in the range of 0.02:1 to 3:1, and more preferably in the range of 0.05:1 to 2:1 (low-molecular compound:binder). The thermal releasing layer desirably covers almost entire surface of the photothermal conversion layer and a thickness thereof is generally in the range of 0.03 to 1 μm and particularly preferably in the range of 0.05 to 0.5 μm.

In the case of a configuration in which a photothermal conversion layer (including a thermal releasing layer) and a thermal transfer layer are laminated in this order on a support, the thermal releasing layer is decomposed or denatured by heat that has been transmitted from the photothermal conversion layer to generate a gas. By the decomposition or generation of a gas, part of the thermal releasing layer may be lost or cohesion failure may be caused in the thermal releasing layer to decrease the bonding force between the photothermal conversion layer and thermal releasing layer. Therefore, depending on the behavior of the thermal releasing layer; part of the thermal releasing layer may stick to the thermal transfer layer and may eventually appear on the surface of the formed image, thereby causing color mixing of an image in some cases. Accordingly, the degree of coloring of the thermal releasing layer is desirably less (that is, high light transmittance to visible light) so that the color mixing does not visually appear on the formed image even if the transfer of thermal releasing layer should occur. Specifically, the thermal releasing layer preferably has an optical absorption to visible light of 50% or less, and more preferably 10% or less.

In the case of a configuration in which a photothermal conversion layer (including a thermal releasing layer) and a thermal transfer layer are laminated in this order on a support, the thermal transfer layer may be disposed via the thermal releasing layer on the photothermal conversion layer. Further, the thermal transfer layer may be directly disposed on the photothermal conversion layer. The thermal transfer layer is mainly composed of a colorant such as pigment for forming a color filter, and a thermoplastic binder.

The pigments are generally roughly divided into organic pigments and inorganic pigments. The former particularly exhibit an excellent transparency when used in a coated film and the latter generally exhibit an excellent masking property. Accordingly, the organic pigment is preferred for use in a color filter. Examples of the preferable pigment include azo pigments, phthalocyanine pigments, anthraquinone pigments, dioxazine pigments, quinacridone pigments, isoindolinone pigments and nitro pigments. The following are typical examples of pigment of each color.

(1) Red Pigment

Pigment Red 48:1 (C. I. No. 15865:1)

Examples: LIONEL RED 2B-FG3300 (trade name, manufactured by TOYO INK MFG CO., LTD.), SYMULER RED NRY, SYMULER RED 3108 (trade name, manufactured by DIC Corporation)

Pigment Red 48:3 (C. I. No. 15865:3)

Examples: PERMANENT RED 3RL (trade name, manufactured by Clariant Japan), SYMULER RED 2BS (trade name, manufactured by DIC Corporation)

(2) Blue Pigment

Pigment Blue 15:6 (C. I. No. 74160)

Examples: LIONOL BLUE ES (trade name, manufactured by TOYO INK MFG. CO., LTD.)

Pigment Blue 60 (C. I. No. 69800)

Examples: HOSTERPERM BLUE RL01 (trade name, manufactured by Clariant Japan), LIONOGEN BLUE 6501 (trade name, manufactured by TOYO INK MFG. CO., LTD.)

(3) Green Pigment

Pigment Green 7 (C. I. No. 74260)

Examples: FASTOGEN GREEN S (trade name, manufactured by DIC Corporation)

Examples of the thermoplastic binder for the thermal transfer layer include thermoplastic polymers as mentioned below.

Cellulose derivatives such as methyl cellulose, ethyl cellulose and cellulose triacetate; homopolymers or copolymers of acrylic acid monomer such as acrylic acid, methacrylic acid, acrylic acid ester and methacrylic acid ester; vinyl polymers such as polyvinyl chloride, vinyl acetate, polyvinyl butyral and polyvinyl formal; styrenic polymers such as polystyrene and styrene-maleic acid copolymer; rubber polymers such as polybutadiene and polyisoprene; polyolefins and copolymers thereof such as polyethylene and ethylene-vinyl acetate copolymer; phenolic resins; and ionomer resins. Among the foregoing resins, those having a Tg in the range of 30 to 120° C. are preferred, such as polyvinyl butyral and acrylic polymers. The average molecular weight of the thermoplastic polymer is desirably in the range of 5,000 to 100,000. The pigment and the thermoplastic resin binder are preferably contained in the range of 0.5:1 to 4:1 (pigment:thermoplastic polymer) by weight ratio in the thermal transfer layer.

The thermal transfer layer preferably contains wax. The wax preferably has a melting point in the range of 40 to 160° C., and mineral waxes, natural waxes and synthetic waxes are normally used.

Examples of the mineral wax include petroleum waxes such as paraffin wax, microcrystalline wax, ester wax and oxidized wax, montan wax, ozokerite and cerecin. Among these, paraffin wax is preferred. The paraffin wax is a product obtained by isolating from petroleum, and various kinds of products having a different melting point are commercially available.

Examples of the natural wax include plant waxes such as carnauba wax, Japan wax, ouricury wax and esparu wax; and animal waxes such as bees wax, insect wax, shellac wax and whale wax.

The synthetic wax is generally used as a lubricant and usually made of higher fatty acid compound. Examples of the synthetic wax are shown below.

1) Fatty Acid Wax

A straight-chain saturated fatty acid represented by the following formula:

$CH_3(CH_2)_nCOOH$ (n represents an integer of from 6 to 28)

Examples: stearic acid, behenic acid, palmitic acid, 12-hydroxystearic acid and azelaic acid.

2) Fatty acid ester wax (esters of the foregoing fatty acids)

Examples: ethyl stearate, lauryl stearate, ethyl behenate, hexyl behenate and behenyl myristate.

3) Fatty acid amide wax (amides of the foregoing fatty acids)

Examples: stearic acid amide and lauric acid amide.

4) Aliphatic alcohol wax

A straight-chain saturated aliphatic alcohol represented by the following formula:

$CH_3(CH_2)_nOH$ (n represents an integer from 6 to 28)

Examples: stearyl alcohol.

Among the synthetic waxes, higher fatty acid amides such as stearic acid amide and lauric acid amide and derivatives thereof are particularly preferred. Further, the waxes may be used alone or in combination of two or more. The content of the wax is in the range of 50 parts by weight or less and preferably in the range of 3 to 20 parts by weight with respect to 100 parts by weight of total amount of the pigment and binder (thermoplastic resin) in the thermal transfer layer.

The heat-sensitive transfer layer preferably contains a surfactant. The surfactant may be any general surfactant without particular restriction. Examples thereof include anionic surfactants (higher fatty acid salts such as sodium stearate), nonionic surfactants (compounds having an oxyethylene chain such as polyoxyethylene alkyl ether), cationic surfactants (such as tetraalkyl ammonium salt) and amphoteric surfactants (compounds having both an acid group and a basic group in a molecule, such as N,N-dialkylamino alkylene carboxylate). In particular, surfactants having an element such as fluorine or silicon in an oleophilic group are preferred because these can exhibit a large effect in small amounts.

The heat-sensitive transfer layer may further contain a plasticizer. It is particularly preferable to include a plasticizer to improve the adhesiveness when multiple thermal transfer layers are laminated on the same transparent image-receiving layer in order to form a multicolor image.

Details of the surfactants and plasticizers are described in paragraphs [0040] through of JP-A No. 9-169165.

The "device substrate provided with an electroluminescent layer on a support" that is prepared prior to the formation of the color filter may be prepared, in the case of an organic EL device, by forming a positive electrode, a luminescent layer, optionally a hole injection-transporting layer; optionally an electron injection-transporting layer, and further forming a negative elect-ode. The organic FL device may also be formed by forming the aforementioned layers in an inverted order.

In what follows, an exemplary preparation of an organic EL device including a positive electrode/hole injection layer/luminescent layer/electron injection layer/negative electrode that are sequentially disposed on a substrate will be described.

In the beginning, a positive electrode is prepared by forming a thin film made of a positive electrode material by means of a deposition method or a sputtering method on an appropriate transparent substrate to a thickness of 1 μm or less. Then, a hole injection layer is disposed on the positive electrode by means of a vacuum deposition method, a spin coat method, a cast method or an LB method. The vacuum deposition method is preferred because a homogeneous film may be readily obtained and formation of pin holes may be suppressed. When the hole injection layer is formed by the vacuum deposition method, deposition conditions thereof may vary depending on the compound to be used (material for hole injection layer), a crystal structure or recombination structure of the desired hole injection layer, or the like, but are appropriately selected from a temperature of a vapor deposition source of from 50 to 450° C., a vacuum of from $10^{-7}$ to $10^{-3}$ Torr, a deposition speed of from 0.01 to 50 nm/sec, a substrate temperature of from −50 to 300° C. and a film thickness of from 5 nm to 5 μm, respectively. Next, a luminescent layer is disposed by forming a thin film of an organic luminescent material with a desired organic luminescent material on the hole injection layer by use of a vacuum deposition method, a sputtering method, a spin coat method or a cast method. The vacuum deposition method is preferred because a homogeneous film may be readily obtained and formation of pin holes may be suppressed. Subsequently, an electron injection layer is disposed on the luminescent layer The vacuum deposition method is preferred for forming a homogeneous film. The deposition conditions may be selected from the condition ranges similar to those of the hole injection layer and luminescent layer. Thereafter, a metal film is laminated by use of a vapor-deposition method or a sputtering method to form a negative electrode, thereby obtaining an organic EL device. The organic EL device is preferably prepared by forming all the components of from the positive electrode to negative electrode at one vacuuming.

The following are exemplary embodiments of the invention. However, the invention is not limited thereto.

1. An electroluminescent device comprising:
    a substrate on which a first electrode is formed;
    a transparent substrate disposed on the first electrode side of the substrate;
    a color filter disposed between the first electrode and the transparent substrate;
    an electroluminescent layer disposed between the first electrode and the color filter; and
    a second electrode disposed between the electroluminescent layer and the color filter.

2. The electroluminescent device according to 1, further comprising a transparent image-receiving layer having a thermal adhesiveness disposed between the second electrode and the color filter 3. The electroluminescent device according to 1, wherein the transparent substrate is a gas barrier film comprising, on a transparent film, a barrier layer comprising an organic region and an inorganic region.

4. The electroluminescent device according to 3, wherein the barrier layer comprises at least one organic layer and at least one inorganic layer.

5. The electroluminescent device according to 1, further comprising a scattering member disposed between the color filter and the transparent substrate, the scattering member including a binder and light-scattering particles.

6. The electroluminescent device according to 2, wherein the transparent image-receiving layer includes a binder and light-scattering particles.

7. The electroluminescent device according to 1, wherein the electroluminescent layer is an organic electroluminescent layer.

8. A method of producing an electroluminescent device, the method comprising:

positioning a laser thermal transfer sheet on a device substrate comprising a substrate and an electroluminescent layer disposed on the substrate, the laser thermal transfer sheet comprising a photothermal conversion layer that converts laser light to heat and a thermal transfer layer containing a colorant disposed in this order on a support that is transmissive with respect to light of a laser wavelength, such that the thermal transfer layer contacts the electroluminescent layer;

irradiating a predetermined region of the laser thermal transfer sheet from the support side with laser light; and forming a color filter layer by removing the laser thermal transfer sheet from the electroluminescent layer to transfer the region of the laser thermal transfer sheet that has been irradiated with laser light to the electroluminescent layer.

9. The method of producing an electroluminescent device according to 8, wherein the color filter layer has two or more colors and the transfer is conducted a number of times corresponding to the number of colors of the color filter layer by using two or more laser thermal transfer sheets respectively comprising a thermal transfer layer having a different color.

10. The method of producing an electroluminescent device according to 8, wherein the electroluminescent layer is an organic electroluminescent layer 11. An electroluminescent device produced by the method according to 8.

12. A method of producing an electroluminescent device, the method comprising:

positioning a laser thermal transfer sheet on a device substrate comprising a substrate and an electroluminescent layer disposed on the substrate, the laser thermal transfer sheet comprising a photothermal conversion layer that converts laser light to heat and a thermal transfer layer containing a colorant disposed in this order on a support that is transmissive with respect to light of a laser wavelength, such that the thermal transfer layer contacts a surface of the substrate;

irradiating a predetermined region of the laser thermal transfer sheet from the support side with laser light; and forming a color filter layer by removing the laser thermal transfer sheet from the substrate to transfer the region of the laser thermal transfer sheet that has been irradiated with laser light to the surface of the substrate.

13. The method of producing an electroluminescent device according to 12, wherein the color filter layer has two or more colors and the transfer is conducted a number of times corresponding to the number of colors of the color filter layer by using two or more laser thermal transfer sheets respectively comprising a thermal transfer layer having a different color.

14. The method of producing an electroluminescent device according to 12, wherein the electroluminescent layer is an organic electroluminescent layer.

15. An electroluminescent device produced by the method according to 12.

EXAMPLES

In what follows, the invention will be more specifically described with reference to examples. However; the invention is not restricted to the examples described below as long as the gist of the invention is not exceeded. Unless otherwise stated, "parts" are based on weight.

Example 1

Top-Emission Organic EL Display Device

As shown below, a top-emission organic EL display device shown in FIG. 1 was prepared.

In the beginning, TFTs (thin film transistors) corresponding to the number of pixels were formed on an insulating glass substrate 11 via a buffer layer by photolithography, and an interlayer insulating film layer made of a SiN film was deposited over an entire surface of the buffer layer on which the TFTs had been formed. Thereafter, contact holes that communicate a source region and a drain region, respectively, were formed by an ordinary photo-etching process. In the next place, after a conductive layer having a multilayer structure of Al/Ti/Al was deposited over an entire surface, patterning was performed by an ordinary etching process, thereby forming a source electrode extending to the TFTs and a drain electrode. The source electrode was disposed so as to have four branch lines from a common source line. Thereafter, a photosensitive resin was coated over an entire surface of the above structure by a spin coat method to form an interlayer insulating film. Contact holes that correspond to each branch line of the source electrode were formed by exposing the interlayer insulating film to light using a predetermined mask, and then developing with a predetermined developing solution. For the purpose of convenience, the contact hole is formed to the common source line.

In a manner as described above, the TFTs and electrodes of each kind were disposed on glass substrate 11.

Further, an acrylic photosensitive resin (trade name: OPTOMER PC SERIES, manufactured by JSR Corporation) was coated on the above structure to form a flattening layer (not shown in the drawing), followed by forming a contact hole by exposing to light using a photomask.

Subsequently, an Al film was deposited over an entire surface by a sputtering method, followed by patterning to an intended shape by an ordinary photo-etching process, thereby forming a divided lower electrode (positive electrode, not shown in the drawing) that connects to the branch line of the source electrode through the contact hole.

On the above-prepared divided lower electrode, organic compound layers as shown below were sequentially deposited by a vacuum deposition method, thereby forming an organic EL layer 12 including a red-emitting EL layer 12R, a green-emitting EL layer 12G and a blue-emitting EL layer 12B.

(First hole transporting layer)
Copper phthalocyanine: film thickness 10 nm
(Second hole transporting layer)
N,N'-diphenyl-N,N'-dinaphthyl benzidine: film thickness 40 nm
(Red-emitting and electron transporting layer)
Tris(8-hydroxyquinolinate)aluminum 90% containing 5% of nile red 6: film thickness 60 nm
(Green-emitting and electron transporting layer)
Tris(8-hydroxyquinolinate)aluminum 90% containing 5% of couimalin 6: film thickness 60 nm
(Blue-emitting and electron transporting layer)
Tris(8-hydroxyquinolinate)aluminum 90% containing 5% of tetrapheniylbutadiene: filhn thickness 60 nm Thereafter, an AL film having a thickness of 10 nm and an IZO (indium zinc oxide) film having a thickness of 30 nm were sequentially deposited on organic EL layer 12 so as to cover the organic EL layer by a mask deposition method, thereby forming a common upper electrode (negative electrode) 13. The region corresponding to the respective divided lower electrodes each selves as a divided pixel portion.

Further, a SiN film and a SiON film were sequentially deposited over an entire surface of the common upper electrode (negative electrode) 13 by a CVD method so as to cover the entirety of organic EL layer, thereby forming a passivation layer 14 having a thickness of 5 μm.

In the next place, a transparent image-receiving layer was prepared in accordance with the following procedures (1) through (4) as set forth below.

(1) Preparation of Cushion Layer-forming Composition

The following components were mixed by stirring using a stirrer to prepare a cushion layer-forming composition.

| <Composition> | |
|---|---|
| Polyvinyl chloride/vinyl acetate copolymer (trade name: MPR-TSL, manufactured by Nisshin Chemicals Co., Ltd.) | 44 parts |
| Acrylic rubber (trade name: RS-08, manufactured by Nisshin Chemicals Co., Ltd.) | 22 parts |
| Plasticizer (trade name: POLYSIZER W20, manufactured by DIC Corporation) | 22 parts |
| Dioctylmercapto tin (trade name: KS-2000A, manufactured by Kyodo Yakuhin Kogyo) | 0.33 parts |
| Surfactant (trade name: MEGAFAC F-177PF, manufactured by DIC Corporation) | 0.6 parts |
| Methyl ethyl ketone | 135 parts |
| Toluene | 11 parts |
| N,N-dimethylformamide | 0.4 parts |

(2) Formation of Cushion Layer

The resulted cushion layer-forming composition was coated on one surface of a support (polyethylene terephthalate film having a thickness of 100 μm) using a spin coated, followed by drying in an oven set at 100° C. for 5 min, thereby forming a cushion layer (film thickness 23 μm) on the support.

(3) Preparation of Image-receiving Layer Composition

The following components were mixed by stirring using a stirrer to prepare an image-receiving layer-forming composition.

| | |
|---|---|
| Polyvinyl butyral (trade name: DENKA BUTYRAL #2000-L, manufactured by Denki Kagaku Kogyo Kabushiki Kaisha) | 12.5 parts |
| N,N-dimethyl acrylamide/butyl acrylate copolymer (copolymerization composition ratio: 50/50) | 3.2 parts |
| Surfactant (trade name: MEGAFAC F-177PF, manufactured by DIC Corporation) | 0.07 parts |
| N-propyl alcohol | 164 parts |
| 1-methoxy-2-propanol | 10 parts |
| N,N-dimethylformamide | 0.4 parts |

(4) Formation of Image-receiving Layer

The resulting image-receiving layer-forming composition was coated on a surface of the cushion layer that had been formed on the support using a spin coater, followed by drying in an oven set at 100° C. for 5 min, thereby forming an image-receiving layer having a film thickness of 2 μm on a surface of the cushion layer.

An image-receiving sheet having a cushion layer and an image-receiving layer laminated in this order on a support was thus obtained.

The above-obtained image-receiving sheet was left at room temperature for one day, and was superposed a surface of passivation layer 14 so that the image-receiving layer contacts passivation layer 14. In this state, a heat roller (surface rubber hardness A=60°) having a surface temperature of 100° C. was pressed against the image-receiving sheet with a pressure of 10 kg/cm² to secure close contact, followed by releasing the image-receiving sheet at an interface between the image-receiving layer and the cushion layer to transfer a transparent image-receiving layer 15 on passivation layer 14.

In the next place, transfer sheets R, G and B for forming a color filter were prepared in accordance with the following procedures (a) through (g) as set forth below.

(a) Preparation of Photothermal Conversion Layer-forming Composition

The following components were mixed by stirring using a stirrer to prepare a photothermal conversion layer-forming composition.

| <Composition> | |
|---|---|
| Infrared absorbing dye (trade name: IR-820B, manufactured by Nippon Kayaku Co., Ltd.) | 5 parts |
| Binder (trade name: PAA-A (25% solution of N,N-dimethylacetoamide obtained by reacting an aromatic tetracarboxylic dianhydride with a diamine), manufactured by Mitsui Chemicals, Inc.; polyamide acid) | 40 parts |
| Methyl ethyl ketone | 1000 parts |
| 1-methoxy-2-propanol | 1000 parts |
| Surfactant (trade name: MEGAFAC F-177P, manufactured by DIC Corporation) | 1 part |

(b) Formation of Photothermal Conversion Layer

A layer made of a styrene-butadiene copolymer (thickness 0.5 μm) and a gelatin layer (thickness 0.1 μm) were formed in this order on one surface of a 75-μm thick polyethylene terephthalate (PET) film to prepare a support having a primer layer. The obtained photothermal conversion layer-forming composition was applied on the gelatin layer of the support using a spin coater, followed by drying in an oven set at 100° C. for 2 min, thereby forming a photothermal conversion layer having a film thickness of 0.2 μm.

(c) Preparation of Thermal Releasing Layer-forming Composition

The following components were mixed by stirring using a stirrer to prepare a thermal releasing layer-forming composition.

| <Composition> | |
|---|---|
| Nitrocellulose (trade name: TYPE HIG120, manufactured by Asahi Chemical Industry Co., Ltd.) | 16 parts |
| Propylene glycol monomethyl ether acetate | 480 parts |
| Toluene | 1120 parts |
| Surfactant (trade name: MEGAFAC F-177P, manufactured by DIC Corporation) | 0.2 parts |

(d) Formation of Thermal Releasing Layer

The obtained thermal releasing layer-forming composition was applied on a surface of the photothermal conversion layer that had been disposed on the support using a spin coater for 1 min, followed by drying in an oven set at 100° C. for 2 min, thereby forming a thermal releasing layer. The film thickness was determined to be 0.1 μm by average when a section of the thermal releasing layer was observed by a scan-type electron microscope.

(e) Preparation of Red Thermal Transfer Layer-forming Composition

-Preparation of Red Pigment Dispersion-

The following components were put in a mill of a kneader and a shearing force was applied while adding a small amount of solvent, as a pre-dispersion treatment. To the obtained dispersion, a solvent was further added to give the following composition, and the dispersion was further subjected to sand mill dispersion for 2 hr, thereby obtaining red pigment dispersions 1 and 2.

| <Composition of red pigment dispersion 1> | |
|---|---|
| Pigment Red 48: 1 (C. I. No. 15865: 1) (trade name: LIONOEL, RED 2B-FG3300 manufactured by Toyo Ink Mfg. Co., Ltd.) | 8.93 parts |
| Polyvinyl butyral (trade name: ESLEC B BL-SH, manufactured by Sekisui Chemical Co., Ltd.) | 7.50 parts |
| Dispersion aid (trade name: SOLSPERSE S-20000, manufactured by ICI) | 0.47 parts |
| N-propyl alcohol | 83.10 parts |

| <Composition of red pigment dispersion 2> | |
|---|---|
| Pigment Red 48: 3 (C. I. No. 15865: 3) (trade name: SYMULER RED 3108, manufactured by Dainippon Ink & Chemicals, Incorporated) | 8.93 parts |
| Polyvinyl butyral (trade name: ESLEC B BL-SH, manufactured by Sekisui Chemical Co., Ltd.) | 7.50 parts |
| Dispersion aid (trade name: SOLSPERSE S-20000, manufactured by ICI) | 0.47 parts |
| N-propyl alcohol | 83.10 parts |

The average particle diameters of particles in the obtained red pigment dispersions 1 and 2 as measured by a laser scattering particle size distribution analyzer were 192 nm and 193 nm, respectively.

-Preparation of Red Thermal Transfer Layer-forming Composition-

In the next place, the following components were mixed and stirred using a stirrer to prepare a red thermal transfer layer-forming composition.

| <Composition> | |
|---|---|
| n-propyl alcohol | 321.5 parts |
| Methyl ethyl ketone | 89.3 parts |
| Wax-based compound | |
| (stearic acid amide, trade name: NEUTRON 2, manufactured by Nippon Fine Chemical Co., Ltd.) | 0.824 parts |
| (Behenic acid amide, trade name: DIAMIDE BM, manufactured by Nippon Kasei Co., Ltd.) | 0.824 parts |
| (Lauryl acid amide, trade name: DIAMIDE Y, manufactured by Nippon Kasei Co., Ltd.) | 0.824 parts |
| (Palmitic acid amide, trade name: DIAMIDE KP, manufactured by Nippon Kasei Co., Ltd.) | 0.824 parts |
| (Oleic acid amide, trade name: DIAMIDE O-200, manufactured by Nippon Kasei Co., Ltd.) | 0.824 parts |
| (Erucic acid amide, trade name: DIAMIDE L-200, manufactured by Nippon Kasei Co., Ltd.) | 0.824 parts |
| Rosin (trade name: KE-311, manufactured by Arakawa Chemical Industries, Ltd.) (component: resin acid 80 to 97%; resin acid component: abietic acid 30 to 40%, neoabietic acid 10 to 20%, dihydroabietic acid 14%, tetrahydroabietic acid 14%) | 2.360 parts |
| Polyvinyl butyral (trade name: ESLEC B BL-SH, manufactured by Sekisui Chemical Co., Ltd.) | 1.455 parts |
| Red pigment dispersion 1 | 77.40 parts |
| Red pigment dispersion 2 | 24.40 parts |
| Surfactant (trade name: MEGAFAC F-176PF (solid content 20%), manufactured by DIC Corporation) | 1.216 parts |

(f) Formation of Red Thermal Transfer Layer

The red thermal transfer layer-forming composition was coated on a surface of the thermal releasing layer using a wire bar coater for 1 min, followed by drying in an oven set at 100° C. for 2 min, thereby forming a red thermal transfer layer on the thermal releasing layer. As the result of the above process, a laser thermal transfer sheet R having a photothermal conversion layer, a thermal releasing layer and a red thermal transfer layer in this order on a support was prepared.

The thickness of the red thermal transfer layer of the thermal transfer sheet R was 0.71 μm on an average.

(g) Preparation of Laser Thermal Transfer Sheets G and B

-Preparation of Laser Thermal Transfer Sheet G (Green)-

A laser thermal transfer sheet G was prepared in a manner similar to that of the aforementioned laser thermal transfer sheet R except that, in the preparation of laser thermal transfer sheet R, a green thermal transfer layer-forming composition having the following composition was used in place of the red thermal transfer layer-forming composition. The thickness of the thermal transfer layer of the obtained laser thermal transfer sheet G was 0.70 μm on an average.

| Composition of green pigment-dispersion 3 | |
|---|---|
| Pigment Green 7 (C. I. No. 74260) (trade name: FASTOGEN GREEN S, manufactured by DIC Corporation) | 8.93 parts |
| Polyvinyl butyral (trade name: ESLEC B BL-SH, manufactured by Sekisui Chemical Co., Ltd.) | 7.50 parts |
| Dispersion aid (trade name: SOLSPERSE S-20000, manufactured by ICI) | 0.47 parts |
| N-propyl alcohol | 83.10 parts |
| Composition of green pigment dispersion 4 | |
| Polyvinyl butyral (trade name: ESLEC B BL-SH, manufactured by Sekisui Chemical Co., Ltd.) | 7.1 parts |
| Pigment Yellow 180 (C. I. No. 21290) (trade name: NOVOPERM YELLOW P-HG, manufactured by Clariant Japan) | 12.9 parts |
| Dispersion aid (trade name: SOLSPERSE S-20000, manufactured by ICI) | 0.6 parts |
| N-propyl alcohol | 79.4 parts |

The average diameters of particles in t4e obtained green pigment dispersions 3 and 4 as measured by a laser scattering particle size distribution analyzer were 161 nm and 330 nm, respectively.

In the next place, the following components were mixed by shirring using a stirrer to prepare a green thermal transfer layer-forming composition.

| Composition of green thermal transfer layer-forming composition | |
|---|---|
| N-propyl alcohol | 321.5 parts |
| Methyl ethyl ketone | 89.3 parts |
| Wax-based compound | |
| (stearic acid amide, trade name: NEUTRON 2, manufactured by Nippon Fine Chemical Co., Ltd.) | 0.824 parts |
| (Behenic acid amide, trade name: DIAMIDE BM, manufactured by Nippon Kasei Co., Ltd.) | 0.824 parts |
| (Lauryl acid amide, trade name: DIAMIDE Y, manufactured by Nippon Kasei Co., Ltd.) | 0.824 parts |
| (Palmitic acid amide, trade name: DIAMIDE KP, manufactured by Nippon Kasei Co., Ltd.) | 0.824 parts |
| (Oleic acid amide, trade name: DIAMIDE O-200, manufactured by Nippon Kasei Co., Ltd.) | 0.824 parts |
| (Erucic acid amide, trade name: DIAMIDE L-200, manufactured by Nippon Kasei Co., Ltd.) | 0.824 parts |
| Rosin (trade name: KE-311, manufactured by Arakawa Chemical Industries, Ltd.) | 2.360 parts |

-continued

Composition of green thermal transfer layer-forming composition

| | |
|---|---|
| Polyvinyl butyral (trade name: ESLEC B BL-SH, manufactured by Sekisui Chemical Co., Ltd.) | 1.455 parts |
| Green pigment dispersion 3 | 77.11 parts |
| Green pigment dispersion 4 | 24.60 parts |
| Surfactant (trade name: MEGAFAC F-176PF (solid content 20%), manufactured by Dainippon Ink & Chemicals, Incorporated) | 1.216 parts |

-Preparation of Laser Thermal Transfer Sheet B (Blue)-

A laser thermal transfer sheet B was prepared in a manner similar to that of the aforementioned laser thermal transfer sheet R except that, in the preparation of laser thermal transfer sheet R, a blue thermal transfer layer-forming composition having the following composition was used in place of the red thermal transfer layer-forming composition. The average thickness of the thermal transfer layer of the obtained laser thermal transfer sheet B was 0.95 μm on an average.

Composition of blue pigment dispersion 5

| | |
|---|---|
| Pigment Blue 60 (C. I. No. 69800) (trade name: FASTOGEN SUPER BLUE 6070S, manufactured by Dainippon Ink & Chemicals, Incorporated) | 4.02 parts |
| Pigment Blue 15: 6 (C. I. No. 74160) (trade name: LIONOL BLUE 7600, manufactured by Toyo Ink MFG. Co., Ltd.) | 4.02 parts |
| Pigment Violet 23 (C. I. No. 51319) (trade name: HOSTERPERM VIOLET RL-NF, manufactured by Clariant Japan) | 0.89 parts |
| Polyvinyl butyral (trade name: ESLEC B BL-SH, manufactured by Sekisui Chemical Co., Ltd.) | 7.50 parts |
| Dispersion aid (trade name: SOLSPERSE S-20000, manufactured by ICI) | 0.47 parts |
| N-propyl alcohol | 83.10 parts |

The average diameter of particles in the obtained blue pigment dispersion 5 as measured by a laser scattering particle size distribution analyzer was 242 nm.

In the next place, the following components were mixed by stilling using a stirrer to prepare a blue thermal transfer layer-forming composition.

Composition of blue thermal transfer layer-forming composition

| | |
|---|---|
| N-propyl alcohol | 321.5 parts |
| Methyl ethyl ketone | 89.3 parts |
| Wax-based compound (stearic acid amide, trade name: NEUTRON 2, manufactured by Nippon Fine Chemical Co., Ltd.) | 0.824 parts |
| (Behenic acid amide, trade name: DIAMIDE BM, manufactured by Nippon Kasei Co., Ltd.) | 0.824 parts |
| (Lauryl acid amide, trade name: DIAMIDE Y, manufactured by Nippon Kasei Co., Ltd.) | 0.824 parts |
| (Palmitic acid amide, trade name: DIAMIDE KP, manufactured by Nippon Kasei Co., Ltd.) | 0.824 parts |
| (Oleic acid amide, trade name: DIAMIDE O-200, manufactured by Nippon Kasei Co., Ltd.) | 0.824 parts |
| (Erucic acid amide, trade name: DIAMIDE L-200, manufactured by Nippon Kasei Co., Ltd.) | 0.824 parts |
| Rosin (trade name: KE-311, manufactured by Arakawa Chemical Industries, Ltd.) | 2.360 parts |
| Polyvinyl butyral (trade name: ESLEC B BL-SH, manufactured by Sekisui Chemical Co., Ltd.) | 1.455 parts |
| Blue pigment dispersion 5 | 101.80 parts |
| Surfactant (trade name: MEGAFAC F-176PF (solid content 20%), manufactured by DIC Corporation) | 1.216 parts |

With the use of thus obtained laser thermal transfer sheets R, G and B, a color filter 16 including red color pixels 16R, green color pixels 16G and blue color pixels 16G was formed on a transparent image-receiving layer 15 as shown in FIG. 1, in accordance with the following process.

The exposure was performed by an infrared laser irradiation unit including, as shown in FIG. 7A, a laser head assembly 65 having a suction stage 61 for fixing by vacuum-suctioning a substrate (laminate) and a laser unit 64 on which an infrared semiconductor laser is mounted so that the laminate can be irradiated with infrared laser light emitted from laser unit 64; and a CCD camera unit 66 fixed and disposed to laser head assembly 65. In the beginning, a laser thermal transfer sheet R was superposed on a transparent image-receiving layer so as to contact the red thermal transfer layer with the surface of transparent image-receiving layer and was vacuum-suctioned to fix. In this state, a heat roller having a surface temperature set at 100° C. was pressed against the laser thermal transfer sheet R with a pressure of 10 kg/cm$^2$ to secure close contact, followed by cooling at room temperature for about 10 min. Then, images of pixel patterns including the periphery thereof at predetermined three or more positions on the divided lower electrode of Al film were recorded by CCD camera unit 66. Within the recorded image, pixel patterns corresponding to a predetermined reference pixel pattern were detected by a pattern matching algorism, and the positional coordinates thereof were determined and compared with the predetermined positional coordinates. From the difference in each coordinate, the positional displacement, dimensional displacement (multiplication) and angular displacement as a whole were calculated and, based on the result, coordinate conversion of bit-map exposure data was performed. By laser head assembly 65 having laser unit 64, semiconductor laser light having a wavelength of 830 nm was collected from a PET support-side of laser thermal transfer sheet R so that a beam diameter (half-value diameter) was 7 μm±1 μm at a surface of the photothermal conversion layer in contact with the thermal releasing layer. Laser thermal transfer sheet R was irradiated by laser head assembly 65 with laser light that was ON/OFF modulated in accordance with converted exposure data signal, while scanning in a main scanning direction and traveling in a sub-scanning direction b substantially orthogonal to the main scanning direction, at a pitch of 0.5 μm at every scanning. In this way, a color filter having a red color was transferred only on a red-emitting EL layer of organic EL layer formed on the transparent image-receiving layer. After all of the pixels of red-emitting EL layer had been transferred, the vacuum suctioning was stopped.

The laser irradiation conditions in the above process were as follows.

Laser Irradiation Conditions

Laser power (on image formation layer): 110 mW/cm$^2$

Scanning speed in main scanning direction: linear speed 8 m/sec

Sub-scanning pitch: 0.5 μm

Recording image: modulated semiconductor laser by data signal (mask pattern for red color filter) from a controller In the next place, laser thermal transfer sheet R was released from the transparent image-receiving layer at an interface of the thermal releasing layer and the red thermal transfer layer, thereby forming red pixels (color filter layer) 16R on the transparent image-receiving layer. Thereafter, green pixels 16G and blue pixels 16B were formed by changing laser thermal transfer sheet R to laser thermal transfer sheet G and thermal transfer sheet B, respectively, and conducting a similar process to the above.

Further, a scattering layer-forming composition was prepared by mixing the following components, and was applied on color filter 16 to form a scattering member 17 having a thickness of 5 μm.

| <Composition of scattering layer-forming composition> | |
|---|---|
| Acrylic copolymer emulsion shown below | 100.0 parts |
| Light scattering particles (polymethacrylate beads) (trade name: MX150 (particle diameter 1.5 μm, refractive index 1.49), manufactured by Soken Chemical & Engineering Co., Ltd.) | 17 parts |
| Refractive index-controlling inorganic fine particles ($ZrO_2$ filler) | 100.0 parts |
| Dispersant (trade name: NEOGEN P, manufactured by Dai-ichi Kogyo Seiyaku Co., Ltd.) | 0.1 parts |
| Defoamer (trade name: SN DEFOAMER, manufactured by Sannopco) | 0.1 part |

Preparation of Acrylic Copolymer Emulsion

In a four-neck flask provided with an agitator, a reflex cooling pipe, a thermometer and a nitrogen blowing line, 30 parts of water and 0.1 part of ammonium persulfate were put and heated to 70° C. in an nitrogen-purged atmosphere, and an emulsified monomer mixture having the following composition was dripped in over 4 hr. After the dripping, the mixture was further reacted further for 3 hr, thereby preparing an acrylic copolymer emulsion having a solid content of 50%.

| Composition of emulsified monomer mixture | |
|---|---|
| N-butyl acrylate | 49.5 parts |
| 2-ethylhexyl acrylate | 50 parts |
| Acrylic acid | 0.5 parts |
| Water | 70 parts |
| Dodecyl mercaptan | 0.05 parts |
| Sodium lauryl sulfate | 0.5 parts |
| Nonionic emulsifier (trade name: NOIGEN EA140, manufactured by Dai-ichi Kogyo Seiyaku Co., Ltd.) | 1.0 parts |

A gas barrier film (1) having an adhesive layer, prepared in accordance with the following process, was used as a sealing film. The gas barrier film was superposed on a laminate structure portion of organic EL layer (on scattering member 17) so that the adhesive layer contacts the laminate structure portion, laminated by a vacuum laminator disposed in a nitrogen-purged glove box and heated at 100° C. for 1 hr; thereby forming a barrier film 20 so that the laminate structure portion such as the organic EL layer was covered with an adhesive agent layer 18, as shown in FIG. 1. The layer structure of gas barrier film (1) is shown in Table 1 below. Thereafter, a UV-curable acrylic urethane resin was further applied and cured by UV-rays, thereby forming a hardcoat layer 21 on barrier film 20.

In this way, a top-emission organic EL display device of the invention was prepared.

Preparation of Gas Barrier Film

A polyethylene naphthalate (PEN; trade name: Q65A (thickness 100 μm), manufactured by Teijin DuPont) film was used as a base film. On the base film, an inorganic layer, an organic layer, an inorganic layer, an organic layer, an inorganic layer, an organic layer, an inorganic layer and an adhesive layer were disposed in this order from the PEN film side, thereby forming a gas barrier film. The inorganic layer; organic layer and adhesive layer were each formed in accordance with the following process.

1. Formation of Inorganic Layer (X)

An inorganic layer X made of aluminum oxide was formed on the PEN film by a reactive sputtering unit. In what follows, specific film formation conditions will be described.

A vacuum chamber of the reactive sputtering unit was evacuated so that the pressure was $5 \times 10^{-4}$ Pa by use of all oil rotary pump and a turbo-molecular pump. Then, argon was introduced as a plasma gas and an electric power of 2000 W was inputted from a plasma power source. A high-purity oxygen gas was introduced in the chamber and the deposition pressure was controlled to 0.3 Pa and deposition was performed for a certain period of time, thereby forming an inorganic layer made of aluminum oxide. The obtained aluminum oxide film had a film thickness of 40 nm and a film density of 3.01 g/cm$^3$.

2. Formation of Organic Layers (Y, Z)

An organic layer was prepared in two ways, namely, in a method of applying a solvent under normal pressure (organic layer Y) and in a method of performing flash deposition tinder reduced pressure (organic layer Z). Details of the film formation method are as follows.

2-1. Film Formation by Solvent Coating Under Normal Pressure (Organic Layer Y)

2-1-1. Formation of Organic Layer (Y-1)

A coating composition was prepared by dissolving 9 g of tripropylene glycol diacrylate (TPGDA, manufactured by Daicel-Cytec Co., Ltd.) as a photopolymerizable acrylate and 0.1 g of a photopolymerization initiator (trade name: IRGACURE 907, manufactured by Ciba Japan, K. K.) in 190 g of methyl ethyl ketone. The coating composition was applied on a flexible supporting substrate by use of a wire bar coated; followed by irradiating with UV-rays at an illuminance of 350 mW/cm$^2$ and an illumination amount of 500 mJ/cm$^2$ by use of a 160 W/cm air-cooling metal halide lamp (manufactured by EYE GRPHICS Co., Ltd.) under nitrogen-purged atmosphere with an oxygen concentration of 0.1% or less, thereby forming an organic layer Y-1. The film thickness was about 500 nm.

2-1-2. Formation of Organic Layer (Y-2)

An organic layer Y-2 was formed in a similar manner to organic layer Y-1, except that the tripropylene glycol diacrylate (TPGDA) was changed to trimethylolpropane triacrylate (TMPTA, manufactured by Shin-Nakamura Chemical Co., Ltd.). The film thickness was about 500 nm.

2-1-3. Formation of Organic Layer (Y-3)

An organic layer Y-3 was formed in a similar manner to organic layer Y-1, except that the tripropylene glycol diacrylate (TPGDA) was changed to pentaerythritol tetraacrylate (PETA, manufactured by Shin-Nakamura Chemical Co., Ltd.). The film thickness was about 500 nm.

2-2. Film Formation by Flash Vapor-deposition Method Under Reduced Pressure (Organic Layer Z)

2-2-1. Formation of Organic Layer (Z-1)

A vapor-deposition solution was prepared by mixing 9.7 g of butylethylpropane diol diacrylate (BEPGA, manufactured by Kyoeisha Chemical Co., Ltd.) as a photopolymerizable acrylate and 0.3 g of a photopolymerization initiator (trade name: EZACURE-TZT, manufactured by Lamberti S.p.A.). The vapor-deposition solution was vapor-deposited on an organic film by a flash vapor-deposition method under condition of internal pressure of the vacuum chamber of 3 Pa. Subsequently, under the same vacuum conditions, an organic layer Z-1 was prepared by irradiating with UV-rays at an illumination amount of 2 J/cm$^2$. The film thickness was about 1200 nm. In the formation of organic layer Z-1, an organic/inorganic laminate-formation device (trade name: GUARDIAN 200, manufactured by Vitex Systems) was used.

2-2-2. Formation of Organic Layer (Z-2)

An organic layer Z-2 was formed in a similar manner to organic layer Z-1, except that the butylethylpropane diol diacrylate (BEPGA) was changed to trimethylolpropane triacrylate (TMPTA, manufactured by Shin-Nakamura Chemical Co., Ltd.). The film thickness was about 1200 nm.

2-2-3. Formation of Organic Layer (Z-3)

An organic layer Z-3 was formed in a similar manner to organic layer Z-1, except that the butylethylpropane diol diacrylate (BEPGA) was changed to pentaerythritol tetraacrylate (PETA, manufactured by Shin-Nakamura Chemical Co., Ltd.). The film thickness was about 1200 nm.

3. Preparation of Gas Barrier Film

A gas barrier film was prepared by sequentially laminating the inorganic layers and organic layers on a PEN film so as to have a configuration shown in Table 1 below, and further laminating an adhesive layer described below on the inorganic layer. The inorganic layers and organic layers were laminated according to the following two methods. Formation of inorganic layer and organic layer

3-1. Method of Repeating Formation of Organic Layer by Solvent Coating and Formation of Inorganic Layer Under Reduced Pressure (Lamination Method A)

An organic layer and an inorganic layer were alternately laminated on a substrate. When an inorganic layer is laminated on an organic layer, the organic layer that had been formed by solvent coating was put in a vacuum chamber. The vacuum chamber was evacuated and after being left for a certain period of time at a vacuum of $10^{-3}$ Pa or less, an inorganic layer was formed on the organic layer. When an organic layer is laminated on the inorganic layer, the inorganic layer was formed by solvent coating immediately after the formation of the inorganic layer.

3-2. Method of Integrally Forming Organic Layer and Inorganic Layer Under Reduced Pressure (Lamination Method b)

An organic layer and an inorganic layer were laminated using the aforementioned organic/inorganic laminate-forming device GUARDIAN 200. Since this device performs formation of both the organic layer and inorganic layer tinder reduced pressure, and film formation chambers for the organic layer and inorganic layer communicate to each other, the film formation can be conducted in a consecutive manner under reduced pressure. Accordingly, the chamber is not opened to au until the formation of a barrier layer including the organic layers and inorganic layers is completed.

Formation of Adhesive Layer

A thermosetting adhesive 20X-325C (trade name, manufactured by Threebond, adhesion temperature: 90° C.) was disposed on an inorganic layer that is positioned as the uppermost layer on the PEN film, thereby forming an adhesive layer that is cured upon heating.

In Example 1, the formation method of organic layer Y was described with reference to the formation of organic layers Y-1 to Y-3 in which an organic film is formed by solvent coating under normal pressure. However, tie following method of forming an organic layer Y-4 is also applicable. The same also applies to the following Examples 2 to 10.

Formation of Organic Layer Y-4

An organic layer Y-4 was formed in a similar manner to organic layer Y-1, except that the tripropylene glycol diacrylate (TPGDA) was changed to dipentaerythritol hexaacrylate (DPHA, manufactured by Shin-Nakamura Chemical Co., Ltd.). The film thickness was about 500 nm.

Furthermore, although the method of forming the inorganic layer and organic layer is described with reference to the aforementioned lamination methods A and B, a method described below (lamination method C) in which a first layer is formed as an organic layer by solvent coating and the remaining layers (organic layer and inorganic layer) are integrally formed under reduced pressure is also applicable. The same also applies to the following Examples 2 to 10.

Lamination Method C

An organic layer was formed as a first layer on a PEN film by solvent coating, and the PEN film on which the organic layer had been formed was put in a vacuum chamber. The vacuum chamber was evacuated and after being left for a certain period of time at a vacuum of $10^{-3}$ Pa or less, an inorganic layer and an organic layer was alternately formed on the organic layer.

Examples 2 to 6

Top-emission organic EL display devices of the invention were prepared in a manner similar to Example 1, except that gas barrier film (1) was changed to gas barrier films (2) through (6) shown in Table 1, respectively.

The gas barrier film has a structure of PEN film/barrier layer, in which the barrier layer has a structure of inorganic layer/organic layer/inorganic layer/organic layer/inorganic layer/organic layer/inorganic layer/adhesive layer.

TABLE 1

| | Kind | Inorganic Layer | Organic layer | Lamination method | Adhesive layer |
|---|---|---|---|---|---|
| Example 1 | (1) | X | Y-1 | A | 20X-325C |
| Example 2 | (2) | X | Y-2 | A | 20X-325C |
| Example 3 | (3) | X | Y-3 | A | 20X-325C |
| Example 4 | (4) | X | Z-1 | B | 20X-325C |
| Example 5 | (5) | X | Z-2 | B | 20X-325C |
| Example 6 | (6) | X | Z-3 | B | 20X-325C |

Example 7

A top-emission organic EL display device of the invention was prepared in a manner similar to Example 1, except that the light scattering particles and the refractive index-controlling inorganic fine particles, which were used to prepare a scattering layer-forming composition, were changed to benzoguanamine beads (trade name: EPOSTER MS (particle diameter: 1.0 μm, refractive index: 1.66), manufactured by Nippon Shokubai Co., Ltd.) as the light scattering particles and a $SiO_2$ filler as the refractive index-controlling inorganic fine particles, respectively.

Example 8

A top-emission organic EL display device of the invention was prepared in a manner similar to Example 1, except that scattering member 17 was not formed on color filter 16, and that the composition of image-receiving layer-forming composition was changed to the following composition including light scattering particles and refractive index-controlling inorganic fine particles.

<Composition of image-receiving layer-forming composition>

| | |
|---|---|
| Polyvinyl butyral (trade name: Denka Butyral #2000-L, manufactured by Denki Kagaku Kogyo Kabushiki Kaisha) | 12.5 parts |
| N,N-dimethylacrylamide/butyl acrylate copolymer (copolymerization composition ratio: 50/50) | 3.2 parts |

-continued

<Composition of image-receiving layer-forming composition>

| | |
|---|---|
| Surfactant (trade name: MEGAFAC F-177PF, manufactured by DIC Corporations) | 0.07 parts |
| N-propyl alcohol | 164 parts |
| 1-methoxy-2-propanol | 10 parts |
| N,N-dimethylformamide | 0.4 parts |
| Light scattering particles (polymethyl methacrylate beads) (trade name: MX150, particle diameter: 1.5 µm, refractive index: 1.49, manufactured by Soken Chemical & Engineering Co., Ltd.) | 1 part |
| Refractive index-controlling inorganic fine particles ($ZrO_2$ filler) | 5 parts |

Example 9

A top-emission organic EL display device of the invention was prepared in a manner similar to Example 1, except that organic EL layer 12 including red-emitting layer 12R, green-emitting layer 12G and blue-emitting layer 12B was changed to a white-emitting organic EL layer 22 disposed on a divided lower portion electrode, as shown in FIG. 2.

White-emitting organic EL layer 22 includes, though not shown in the drawing, a hole transporting layer made of polyvinyl carbazole (PVK) that has a high hole transportability but no electron transportability; an electron transporting white-emitting layer containing, in polymethyl methacrylate (PMMA), electron transporting oxadiazole derivative (PBD) and a small amount of fluorescent dyes as a luminescent center of tetraphenyl butadiene (TPB), coumarin 6, DCM1 and nile red; and a metal electrode. When a DC voltage is applied to the divided lower electrode (+) and a metal electrode (−), a white light emission is obtained. The fluorescent dyes simultaneously emit light of blue (TPB), green (coumarin), yellow (DCM1) and red (nile red), thereby exhibiting white color.

The principle of above light emission is as follows. In the beginning, holes are injected from the divided lower electrode to the PVK layer to reach an interface of the PVK layer and the PMMA layer. Since the PMMA layer is electron transportable and has a low hole transportability, the holes are blocked by PMMA in the proximity of the interface of PVK and PMMA layers, and are prevented from reaching the negative electrode. Similarly, electrons that has been injected from the metal electrode of the negative electrode through the electron transportable PBD into the PMMA layer are blocked by the PVK layer having no electron transportability, and are prevented from reaching the positive electrode. As a result, recombination of electrons and holes occurs in the proximity of interface of an organic layer or in the PMMA layer including PBD having a small hole transportability, thereby exciting the fluorescent dyes to emit white light.

Example 10

Bottom-emission Organic EL Display Device

A bottom-emission organic EL display device shown in FIG. 5 was prepared in the following manner. In the beginning, TFTs (not shown) were formed on a 0.2-mm thick PES substrate 31 via a buffer layer 33 by photolithography, and an acrylic photosensitive resin (trade name: OPTOMER PC SERIES, manufactured by JSR) was coated thereon to form a flattening layer (not shown). Thereafter an organic EL layer 32 was formed by sequentially vapor-depositing a red-emitting EL layer 32R, a green-emitting EL layer 32G and a blue-emitting EL layer 32B by a vacuum vapor-deposition method in a maimer similar to Example 1. A reflective electrode 30 made of aluminum was laminated on the organic EL layer by vacuum depositing. In the next place, a passivation layer 34 having a thickness of 5 µm was formed by sequentially depositing a SiN film and a SiON film by a CVD method so as to cover an entirety of the above structure. Then, an image-receiving sheet that had been prepared in a manner similar to Example I was superposed on a back surface of glass substrate 31 (the side on which the organic EL layer or the like was not formed) such that the image-receiving layer and glass substrate 31 were in contact with each other. In this state, a heat roller with a surface temperature set at 100° C. was pressed against the image-receiving sheet with a pressure of 10 kg/cm$^2$ to secure close contact, followed by releasing the image-receiving sheet at an interface of the image-receiving layer and cushion layer, thereby transferring a transparent image-receiving layer 35 to glass substrate 31.

Figure 5:
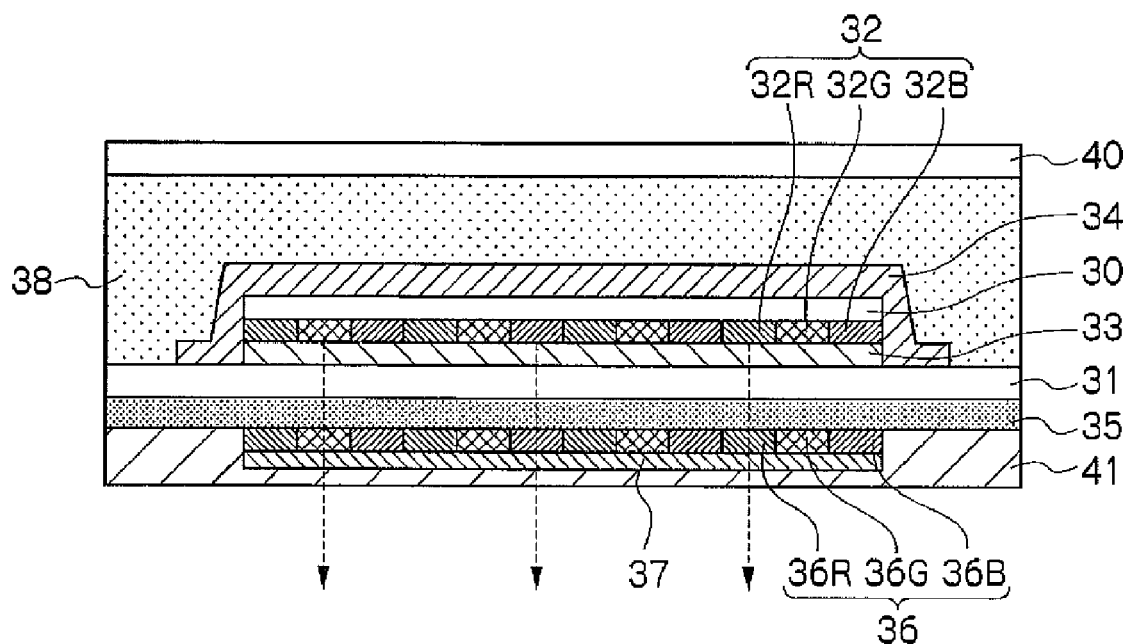
FIG. 5 is a schematic sectional view showing an example of a configuration of a bottom-emission organic EL display device according to one exemplary embodiment of the invention.
Figure 6:
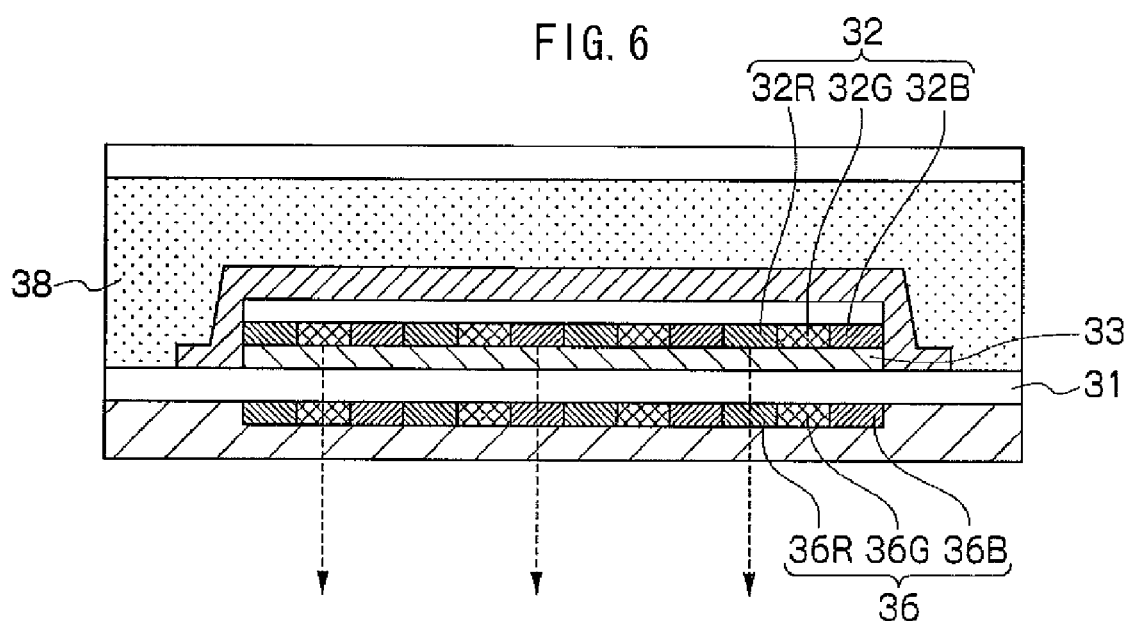
FIG. 6 is a schematic sectional view showing an example of another configuration of a bottom-emission organic EL display device according to one exemplary embodiment of the invention.

In the next place, a thermal color filter 36 made of three colors of red pixels 36R, green pixels 36G and blue pixels 36B was formed on transparent image-receiving layer 35 as shown in FIG. 5 using laser thermal transfer sheets R, G and B in a manner similar to Example 1. A scattering member 37 was disposed on an exposed surface of color filter 36, in a similar manner to Example 1.

A bottom-emission organic EL display device of the invention was thus prepared.

Comparative Example 1

A top-emission organic EL display device was prepared in a manner similar to Example 1, except that a color filter was formed by photolithography on a surface of a gas barrier film (between barrier layer (organic layer or inorganic layer) and adhesive layer) without forming transparent image-receiving layer 15, color filter 16 and light scattering member 17 on passivation layer 14.

Evaluation

Positional displacement that occurs upon bonding the substrate of organic EL display devices prepared in the above Examples 1 to 10 and Comparative Example 1 was evaluated according to the following method.

After forming alignment markings by photolithography at four corners of a rectangle having a size of 20 mm×30 mm, alignment marking of a glass mask used for photolithography were formed so as to conform to the above alignment marking, in such a manner that light-emitting pixels having a size of 90 µm×90 µm are formed on the whole area of the rectangle at an interval of 10 µm (the dimension cannot be adjusted because it is determined by an absolute dimension of the glass mask). In Comparative Example 1, a color filter was formed in accordance with a dimension of a glass mask in a manner similar to emission pixel. In Examples, a color filter was formed at a corrected position so as to conform to positional displacement of light-emitting pixels, by detecting the position of alignment markings by a CCD camera and irradiating with laser light in accordance with the positional data of color filter that had been corrected according to the positional displacement at a reading position.

Evaluation was performed by observing the positional displacement in the gravity center of pixels at the center of four sides of the rectangle of the light-emitting pixels and the same of the color filter, using a microscope. When the maximum value of the displacement at four pixels is 5 µm or less, it was judged as acceptable (A) and when the maximum value exceeds 5 µm, it was judged as unacceptable (N).

TABLE 2

| | Evaluation of positional displacement |
|---|---|
| Example 1 | A |
| Example 2 | A |
| Example 3 | A |
| Example 4 | A |
| Example 5 | A |
| Example 6 | A |
| Example 7 | A |
| Example 8 | A |
| Example 9 | A |
| Example 10 | A |
| Comparative example 1 | B |

Figure 8:
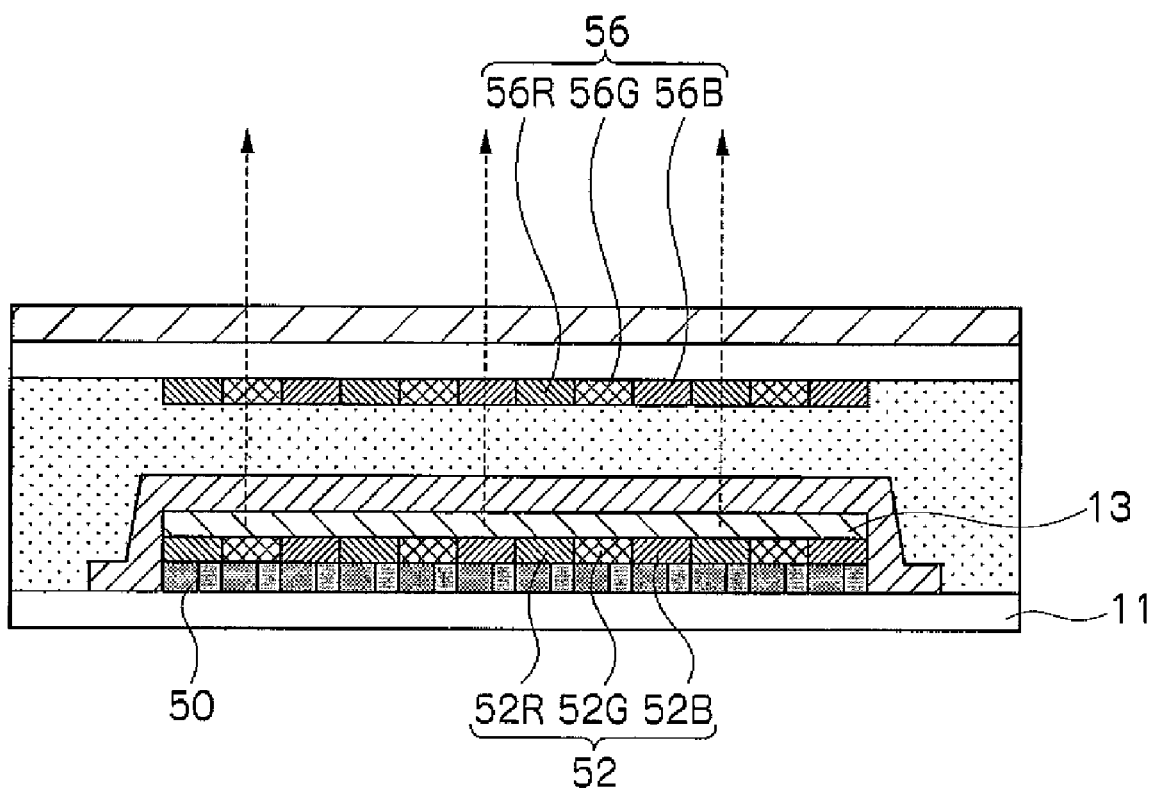
FIG. 8 is a schematic sectional view showing an example of a configuration of an existing top-emission organic EL display device.

As shown in Table 2, positional alignment in organic EL display devices of the invention may be conducted more easily or may be omitted, as compared with the organic EL display device having an existing configuration as shown in FIG. 8. As a result, deterioration in display characteristics or yield due to positional alignment failure may be suppressed, thereby obtaining a luminescent device that achieves high yield and excellent display characteristics such as display color or resolution.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing an electroluminescent device, the method comprising:
    positioning a laser thermal transfer sheet on a device substrate comprising a substrate and an electroluminescent layer disposed on the substrate, a passivation layer, and a transparent image-receiving layer disposed on the passivation layer, the laser thermal transfer sheet comprising a photothermal conversion layer that converts laser light to heat and a thermal transfer layer containing a colorant disposed in this order on a support that is transmissive with respect to light of a laser wavelength, such that the thermal transfer layer contacts the transparent image-receiving layer;
    irradiating a predetermined region of the laser thermal transfer sheet from the support side with laser light; and
    forming a color filter layer by removing the laser thermal transfer sheet from the transparent image-receiving layer to transfer the region of the laser thermal transfer sheet that has been irradiated with laser light to the transparent image-receiving layer,
    wherein the transparent image-receiving layer is formed by contacting, to the passivation layer, a sheet comprising a support, a cushion layer and an image-receiving layer, and removing the support and the cushion layer at an interface between the image-receiving layer and the cushion layer, thereby transferring the image-receiving layer onto the passivation layer.

2. The method of producing an electroluminescent device according to claim 1, wherein the color filter layer has two or more colors and the transfer is conducted a number of times corresponding to the number of colors of the color filter layer by using two or more laser thermal transfer sheets respectively comprising a thermal transfer layer having a different color.

3. The method of producing an electroluminescent device according to claim 1, wherein the electroluminescent layer is an organic electroluminescent layer.

4. An electroluminescent device produced by the method according to claim 1.

5. The method of producing an electroluminescent device according to claim 1, wherein the transparent image-receiving layer has a thermal adhesiveness.

6. The method of producing an electroluminescent device according to claim 1, wherein the device substrate further comprises an electrode between the electroluminescent layer and the transparent image-receiving layer.

7. The method of producing an electroluminescent device according to claim 1, wherein the transparent image-receiving layer comprises polyvinyl butyral and an alkyl acrylate/acrylamide copolymer.

8. A method of producing an electroluminescent device, the method comprising:
    positioning a laser thermal transfer sheet on a device substrate comprising a substrate and an electroluminescent layer disposed on the substrate, and a transparent image-receiving layer disposed on the substrate, the laser thermal transfer sheet comprising a photothermal conversion layer that converts laser light to heat and a thermal transfer layer containing a colorant disposed in this order on a support that is transmissive with respect to light of a laser wavelength, such that the thermal transfer layer contacts a surface of the transparent image-receiving layer;
    irradiating a predetermined region of the laser thermal transfer sheet from the support side with laser light; and
    forming a color filter layer by removing the laser thermal transfer sheet from the transparent image-receiving layer to transfer the region of the laser thermal transfer sheet that has been irradiated with laser light to the surface of the transparent image-receiving layer,
    wherein the transparent image-receiving layer is formed by contacting, to the substrate, a sheet comprising a support, a cushion layer and an image-receiving layer, and removing the support and the cushion layer at an interface between the image-receiving layer and the cushion layer, thereby transferring the image-receiving layer onto the substrate.

9. The method of producing an electroluminescent device according to claim 8, wherein the color filter layer has two or more colors and the transfer is conducted a number of times corresponding to the number of colors of the color filter layer by using two or more laser thermal transfer sheets respectively comprising a thermal transfer layer having a different color.

10. The method of producing an electroluminescent device according to claim 8, wherein the electroluminescent layer is an organic electroluminescent layer.

11. An electroluminescent device produced by the method according to claim 8.

12. The method of producing an electroluminescent device according to claim 8, wherein the transparent image-receiving layer has a thermal adhesiveness.

13. The method of producing an electroluminescent device according to claim 8, wherein the device substrate further comprises an electrode between the electroluminescent layer and the transparent image-receiving layer.

14. The method of producing an electroluminescent device according to claim 8, wherein the transparent image-receiving layer comprises polyvinyl butyral and an alkyl acrylate/acrylamide copolymer.

* * * * *